(12) United States Patent
Maliassov

(10) Patent No.: US 9,754,056 B2
(45) Date of Patent: Sep. 5, 2017

(54) METHOD AND SYSTEM FOR PARALLEL SIMULATION MODELS

(75) Inventor: Serguei Maliassov, Spring, TX (US)

(73) Assignee: ExxonMobil Upstream Research Company, Spring, TX (US)

( * ) Notice: Subject to any disclaimer, the term of this patent is extended or adjusted under 35 U.S.C. 154(b) by 785 days.

(21) Appl. No.: 13/701,421

(22) PCT Filed: Jan. 13, 2011

(86) PCT No.: PCT/US2011/021139
§ 371 (c)(1),
(2), (4) Date: Nov. 30, 2012

(87) PCT Pub. No.: WO2012/003007
PCT Pub. Date: Jan. 5, 2012

(65) Prior Publication Data
US 2013/0090907 A1    Apr. 11, 2013

Related U.S. Application Data

(60) Provisional application No. 61/359,669, filed on Jun. 29, 2010.

(51) Int. Cl.
G06F 17/50    (2006.01)
G06F 9/50    (2006.01)
G06F 9/54    (2006.01)

(52) U.S. Cl.
CPC ........ G06F 17/5009 (2013.01); G06F 9/5088 (2013.01); G06F 9/546 (2013.01)

(58) Field of Classification Search
CPC ............ G01V 2210/66; G06F 17/5009; G06F 9/5088
See application file for complete search history.

(56) References Cited

U.S. PATENT DOCUMENTS

| 5,428,803 A | 6/1995 | Chen et al. |
| 6,052,520 A | 4/2000 | Watts, III |

(Continued)

FOREIGN PATENT DOCUMENTS

| WO | WO 99/28767 | 6/1999 |
| WO | WO 2007/116008 | 5/2007 |

(Continued)

OTHER PUBLICATIONS

Bertozzi, Stefano, Andrea Acquaviva, Davide Bertozzi, and Antonio Poggiali. "Supporting task migration in multi-processor systems-on-chip: a feasibility study." In Proceedings of the conference on Design, automation and test in Europe: Proceedings, pp. 15-20. European Design and Automation Association, 2006.*

(Continued)

*Primary Examiner* — Aniss Chad
(74) *Attorney, Agent, or Firm* — ExxonMobil Upstream Research Company-Law Department

(57) ABSTRACT

A method for modeling a hydrocarbon reservoir. A representation of a simulation model is generated in a non-transitory, computer readable medium. The simulation model is used to generate computational tasks. The tasks are allocated among a plurality of computational nodes. Each processing node of the plurality of computational nodes includes core processors and a shared memory accessible by the core processors. The reservoir simulation is executed on the plurality of computational nodes. During the reservoir simulation, if a first processing node in the plurality of computational nodes finishes executing its allocated tasks, a migration request is sent from the first processing node to another processing node in the plurality of computational nodes. The migration request is configured to request migration of a movable task from the other processing node to the (Continued)

first processing node. The movable task is migrated from the other processing node to the first processing node.

20 Claims, 12 Drawing Sheets

(56) References Cited

U.S. PATENT DOCUMENTS

| | | |
|---|---|---|
| 6,549,879 B1 | 4/2003 | Cullick et al. |
| 6,662,146 B1 | 12/2003 | Watts |
| 6,766,255 B2 | 7/2004 | Stone |
| 6,810,370 B1 | 10/2004 | Watts |
| 6,823,297 B2 | 11/2004 | Jenny et al. |
| 6,826,483 B1 | 11/2004 | Anderson et al. |
| 6,928,399 B1 | 8/2005 | Watts, III et al. |
| 6,980,940 B1 | 12/2005 | Gurpinar et al. |
| 7,177,764 B2 | 2/2007 | Stone |
| 7,203,342 B2 | 4/2007 | Pedersen |
| 7,225,324 B2 | 5/2007 | Huppenthal et al. |
| 7,277,796 B2 | 10/2007 | Kuchuk et al. |
| 7,376,539 B2 | 5/2008 | Lecomte |
| 7,406,878 B2 | 8/2008 | Rieder et al. |
| 7,467,044 B2 | 12/2008 | Tran et al. |
| 7,478,024 B2 | 1/2009 | Gurpinar et al. |
| 7,496,488 B2 | 2/2009 | Jenny et al. |
| 7,516,056 B2 | 4/2009 | Wallis et al. |
| 7,526,418 B2 | 4/2009 | Pita et al. |
| 7,546,229 B2 | 6/2009 | Jenny et al. |
| 7,565,651 B1 | 7/2009 | Carey |
| 7,577,527 B2 | 8/2009 | Vega Velasquez |
| 7,584,342 B1 | 9/2009 | Nordquist et al. |
| 7,596,480 B2 | 9/2009 | Fung et al. |
| 7,603,265 B2 | 10/2009 | Mainguy et al. |
| 7,617,082 B2 | 11/2009 | Childs et al. |
| 7,620,800 B2 | 11/2009 | Huppenthal et al. |
| 7,624,254 B2 | 11/2009 | Smith et al. |
| 7,689,397 B2 | 3/2010 | Ghorayeb et al. |
| 7,739,089 B2 | 6/2010 | Gurpinar et al. |
| 7,788,037 B2 | 8/2010 | Soliman et al. |
| 7,809,537 B2 | 10/2010 | Hemanthkumar et al. |
| 7,809,538 B2 | 10/2010 | Thomas |
| 7,860,654 B2 | 12/2010 | Stone |
| 7,877,246 B2 | 1/2011 | Moncorge et al. |
| 7,933,750 B2 | 4/2011 | Morton et al. |
| 7,953,585 B2 | 5/2011 | Gurpinar et al. |
| 8,050,892 B2 | 11/2011 | Hartman |
| 8,095,345 B2 | 1/2012 | Hoversten |
| 8,190,405 B2 | 5/2012 | Appleyard |
| 8,195,401 B2 | 6/2012 | Ella et al. |
| 8,204,726 B2 | 6/2012 | Lee et al. |
| 8,204,727 B2 | 6/2012 | Dean et al. |
| 8,209,202 B2 | 6/2012 | Narayanan et al. |
| 8,255,195 B2 | 8/2012 | Yogeswaren |
| 8,275,593 B2 | 9/2012 | Zhao |
| 8,280,635 B2 | 10/2012 | Ella et al. |
| 8,280,709 B2 | 10/2012 | Koutsabeloulis et al. |
| 8,301,429 B2 | 10/2012 | Hajibeygi et al. |
| 8,359,184 B2 | 1/2013 | Massonnat |
| 8,359,185 B2 | 1/2013 | Pita et al. |
| 8,386,227 B2 | 2/2013 | Fung et al. |
| 8,396,699 B2 | 3/2013 | Maliassov |
| 8,401,832 B2 | 3/2013 | Ghorayeb et al. |
| 8,412,502 B2 | 4/2013 | Moncorge et al. |
| 8,433,551 B2 | 4/2013 | Fung et al. |
| 8,437,999 B2 | 5/2013 | Pita et al. |
| 8,457,997 B2 | 6/2013 | Narayanan et al. |
| 8,458,000 B2 | 6/2013 | Narayanan et al. |
| 8,463,586 B2 | 6/2013 | Mezghani et al. |
| 8,489,375 B2 | 7/2013 | Omeragic et al. |
| 8,498,852 B2 | 7/2013 | Xu et al. |
| 8,532,967 B2 | 9/2013 | Torrens et al. |
| 8,532,969 B2 | 9/2013 | Li et al. |
| 8,543,364 B2 | 9/2013 | Liu et al. |
| 8,583,411 B2 | 11/2013 | Fung |
| 8,589,135 B2 | 11/2013 | Middya et al. |
| 8,606,524 B2 | 12/2013 | Soliman et al. |
| 8,630,831 B2 | 1/2014 | Bratvedt et al. |
| 8,635,026 B2 | 1/2014 | Ameen |
| 8,655,632 B2 | 2/2014 | Moguchaya |
| 8,775,144 B2 | 7/2014 | Han et al. |
| 8,798,977 B2 | 8/2014 | Hajibeygi et al. |
| 8,805,660 B2 | 8/2014 | Güyagüler et al. |
| 8,812,334 B2 | 8/2014 | Givens et al. |
| 8,818,778 B2 | 8/2014 | Salazar-Tio et al. |
| 8,898,017 B2 | 11/2014 | Kragas et al. |
| 9,043,188 B2 | 5/2015 | Yeten et al. |
| 9,418,180 B2 | 8/2016 | Maliassov |
| 2007/0199721 A1 | 8/2007 | Givens et al. |
| 2007/0279429 A1 | 12/2007 | Ganzer et al. |
| 2008/0126168 A1 | 5/2008 | Carney et al. |
| 2008/0133550 A1 | 6/2008 | Orangi et al. |
| 2008/0208478 A1 | 8/2008 | Ella et al. |
| 2009/0055141 A1 | 2/2009 | Moncorge et al. |
| 2009/0138290 A1 | 5/2009 | Straubhaar |
| 2010/0082724 A1 | 4/2010 | Diyankov et al. |
| 2010/0185428 A1 | 7/2010 | Vink |
| 2010/0223039 A1 | 9/2010 | Maliassov |
| 2010/0299472 A1* | 11/2010 | Tanaka ............... G06F 9/4812 710/269 |
| 2010/0312535 A1 | 12/2010 | Chen et al. |
| 2010/0324873 A1 | 12/2010 | Cameron |
| 2011/0173622 A1* | 7/2011 | Shin ................. G06F 9/4856 718/102 |
| 2011/0310101 A1 | 12/2011 | Prange et al. |
| 2012/0082128 A1 | 4/2012 | Kent et al. |
| 2012/0159124 A1 | 6/2012 | Hu et al. |
| 2012/0179436 A1 | 7/2012 | Fung |
| 2012/0221302 A1 | 8/2012 | Lewandowski et al. |
| 2012/0296619 A1 | 11/2012 | Maliassov et al. |
| 2013/0030782 A1 | 1/2013 | Yogeswaren |
| 2013/0191091 A1 | 7/2013 | Fung et al. |
| 2013/0311098 A1 | 11/2013 | Ameen |
| 2014/0012557 A1 | 1/2014 | Tarman et al. |
| 2014/0236558 A1 | 8/2014 | Maliassov |
| 2014/0281743 A1 | 9/2014 | Hayder et al. |

FOREIGN PATENT DOCUMENTS

| | | |
|---|---|---|
| WO | WO 2007/100703 | 9/2007 |
| WO | WO 2007/135549 | 11/2007 |

OTHER PUBLICATIONS

Blumofe, R. et al. (1994), "Scheduling multithreaded Computations by Work Stealing", Proceedings of the 35th Annual Symposium on Foundations of Computer Science, 29 pgs.
Bova, S.W. et al. (2001), "Parallel Programming with Message Passing and Directives", *Computing in Science & Eng.*, pp. 22-37.
Coats, K.H. (2001), "IMPES Stability: The Stable Step", SPE 69225, SPE Reservoir Simulation Symposium, 10 pgs.
Coats, K.H. (2000), "A Note on IMPES and Some IMPES-Based Simulation Models", *SPE Journal* 5(3), pp. 245-251.
Gropp, W. et al. (1996), "A High-Performance, Portable Implementation of the MPI Message Passing Interface Standard", *Parallel Computing* 22(6), 41 pgs.
Haukas, J. et al. (2007), A Comparison of Two Different IMPSAT Models in Compositional Simulation, *SPE Journal*, pp. 145-151.
Jost, G. et al. (2003), "Comparing the OpenMP, MPI, and Hybrid Progamming Paradigms on an SMP Cluster", NAS Technical Report NAS-03-019, 10 pgs.
Lu, B. et al. (2007), "Iteratively Coupled Reservoir Simulation for Multiphase Flow", SPE 110114, 2007 SPE Annual Technical Conf. & Exh., 9 pgs.
Liu, W. (2000), "Parallel Reservoir Simulation on Shared and Distributed Memory System", SPE 64797, SPE Int'l. Oil & Gas Conf. & Exh., 9 pgs.
Rabenseifner, R. (2003), "Hybrid Parallel Programming on HPC Platforms", 5th European Workshop on OpenMP, EWOMP '03, Aachen, Germany, 10 pgs.
Wan, J. et al. (2005), "General Stability Criteria for Compositional and Black-Oil Models", SPE 93096, 2005 SPE Reservoir Simulation Symposium, 10 pgs.

(56) References Cited

OTHER PUBLICATIONS

Wikipedia, Definitions for "Node (computer science), Core (computer), Asymmetric multiprocessing (section Processor symmetry), Thread (computer science), Message Passing Interface (MPI), Symmetric multiprocessing (redirect from Symmetric Multi-Processor)", Definition for thread from Whatis.com Aug. 31, 2009.

* cited by examiner

100

1200

METHOD AND SYSTEM FOR PARALLEL SIMULATION MODELS

CROSS-REFERENCE TO RELATED APPLICATION

This application is a National Stage of International Application No. PCT/US2011/21139 filed Jan. 13, 2011, which claims the benefit of U.S. Provisional Patent Application 61/359,669 filed 29 Jun. 2010 entitled METHOD AND SYSTEM FOR PARALLEL SIMULATION MODELS, the entireties of which are incorporated by reference herein.

FIELD

Exemplary embodiments of the present techniques relate to a method and system for parallel simulation models that use message passing between shared-memory computational nodes.

BACKGROUND

This section is intended to introduce various aspects of the art, which may be associated with exemplary embodiments of the present techniques. This discussion is believed to assist in providing a framework to facilitate a better understanding of particular aspects of the present techniques. Accordingly, it should be understood that this section should be read in this light, and not necessarily as admissions of prior art.

Numerical simulation is widely used in industrial fields as a method of simulating a physical system by using a computer. In most cases, there is desire to model the transport processes occurring in the physical system. What is being transported is typically mass, energy, momentum, or some combination thereof. By using numerical simulation, it is possible to model and observe a physical phenomenon and to determine design parameters, without actual laboratory experiments and field tests.

Reservoir simulation is of great interest because it infers the behavior of a real hydrocarbon-bearing reservoir from the performance of a model of that reservoir. The typical objective of reservoir simulation is to understand the complex chemical, physical and fluid flow processes occurring in the reservoir sufficiently well to predict future behavior of the reservoir to maximize hydrocarbon recovery. Reservoir simulation often refers to the hydrodynamics of flow within a reservoir, but in a larger sense reservoir simulation can also refer to the total hydrocarbon system, which may include not only the reservoir, but also injection and/or production wells, surface flow lines, and surface processing facilities. Reservoir simulation calculations in such hydrocarbon systems are based on fluid flow through the entire system being simulated. These calculations are performed with varying degrees of rigor, depending on the requirements of the particular simulation study and the capabilities of the simulation software being used.

The principle of numerical simulation is to numerically solve equations describing a physical phenomenon using a computer. Such equations are generally algebraic equations, ordinary differential equations (ODE), and partial differential equations (PDE). As a means for solving differential equations, ODE and/or PDE, numerically, there are known methods such that the finite difference method, the finite volume method, the finite element method, and the like. Regardless of which method is used, the physical system to be modeled is divided into cells, a set of which is called a grid or mesh, and the state variables that vary in time and in space throughout the model are represented by sets of values for each cell. The reservoir rock properties such as porosity and permeability are typically assumed to be constant inside a cell. Other variables such as fluid pressure and phase saturation may be defined at the boundaries between the cells or at specified points within the cell, sometimes referred to as nodes. A link between two nodes is called a "connection." Fluid flow between two cells is typically modeled as flow across a boundary between cells or along the connection between the nodes.

A set of equations may be developed to express the fundamental principles of conservation of mass, energy, and/or momentum within each cell and of movement of mass, energy, and/or momentum between cells. The replacement of the state variables that vary in space throughout a model by a finite number of variable values for each cell is called "discretization." For proper resolution of the modeled physical processes, often hundreds of thousands and even millions of cells are required. That may lead to millions of equations to be solved.

Most reservoir simulators use so-called structured grids in which the cells are assumed to be three-dimensional rectangular shapes distorted to conform as well as possible to geological features and flow patterns. Certain geological features and modeling situations cannot be represented well by structured grids. For example, slanted wells, faults, or fractures that can naturally occur in the reservoir models are almost impossible to model using structured grids. These shortcomings can be overcome in part by using local refinement, in which selected cells are subdivided into smaller cells, and non-neighbor connections, which allow flow between cells that are physically adjacent to each other but are not adjacent in the data structure. A more powerful solution to this problem is to exploit the flexibility provided by layered unstructured grids. In a layered unstructured grid, a computational domain is split into geological layers. In each layer, an unstructured grid is formed by a number of laterally-contiguous irregular-shaped grid cells. The cells forming any layer have corresponding neighbors in the layers located above and below the cell. Such a grid is often referred to as "2.5D grid." However, layered unstructured grids may not be sufficient to describe the variability of complex geologic structures present in real hydrocarbon reservoirs such as branching wells, complex Y-faults, or pinch-outs that occur when the geological layer disappears inside the reservoir. A fully unstructured three-dimensional grid may provide the flexibility to sufficiently describe complex geological structures. Unlike a layered unstructured grid, a fully unstructured grid is a three-dimensional grid that is unstructured in all three directions.

Due to the large number of calculations, reservoir simulation can require substantial computing resources. Furthermore, a totally unstructured grid may require much greater computational resources compared to a structured grid or a layered unstructured grid. To improve the speed of reservoir simulations, proposals have been made to subdivide a simulation model into smaller segments and to perform computations in parallel on a cluster of multi-processor computing nodes. The principal attraction of parallel computing is the ability to reduce the elapsed time of simulation, ideally by a factor of N for an N-processor computing system. Parallel computing falls short of the ideal because of several factors, including recursion in linear equation solution, the overhead associated with message passing required for various computations, and load imbalances due to heterogeneities in the problem physics and characterization of the hydrocarbon fluids.

Today, most computing systems used in high-performance parallel computing feature a hierarchical hardware design that includes shared-memory nodes with several multi-core processors. Such a system may be referred to as a hybrid, because it combines aspects of a shared memory system with aspects of a distributed memory system. The most commonly used parallelization scheme on hybrid systems uses message passing between the computational nodes and OpenMP programming inside symmetric multiprocessor (SMP) nodes due to the relative easiness of programming. Several academic research papers have been published describing the benefits of such an approach See, for example, (G. Jost, et al., "*Comparing the OpenMP, MPI and Hybrid Programming Paradigms on an SMP Cluster*", NAS Technical Report NAS-03-019 (November 2003), available at www.nas.nasa.gov/News/Techreports/2003/PDF/nas-03-019pdf (accessed Jun. 28, 2010); S. W. Bova, et al., "*Parallel Programming with Message Passing and Directives*", Computing in Science and Engineering, pp. 22-37 (September 2001); and R. Rabenseifner, "*Hybrid Parallel Programming on Parallel Platforms*", The Fifth European Workshop on OpenMP, available at www.compunity.org/events/ewomp03/omptalks/Tuesday/Session7/T01p.pdf (accessed Jun. 28, 2010). The parallelization schemes described in the above references may provide substantial efficiency in cases of homogeneous computational load, for example, when parallelizing loops inside each SMP node. However, in reservoir simulation applications it may be difficult to achieve good speed-up using such an approach due to irregularity of computational loads between the computational nodes and between cores inside the nodes. For application programs with dynamically changing computation and data access behavior, a more flexible programming model that achieves better efficiency may be desirable.

U.S. Pat. No. 7,565,651 suggests a parallel task scheduling system in a multi-threaded computing environment. The patent suggests using one communication thread, one parallel task scheduler implemented in a separate thread, and a plurality of working threads. The scheduler maintains a plurality of task queues, each task queue being dedicated to a particular working thread. The scheduler feeds the task queues with tasks according to a scheduling algorithm. While that scheme may provide much better load balancing of irregular tasks then any one built with the use of OpenMP programming, it may be not flexible enough for task-based parallelism required for reservoir simulation applications. Having just one communication thread and a single task scheduler forces any worker thread to wait its turn to communicate with the scheduler and exchange data with the communication thread. Also, having separate task queues for separate threads easily leads to misbalance of the computational load between the working threads.

In reservoir simulation, several approaches to parallel computations have been developed. The publication W. Liu, et al., "*Parallel Reservoir Simulation on Shared and Distributed Memory System*", SPE 64797 (2000), considers three-dimensional distorted rectangular grids on which the reservoir simulation problem is solved in time using pure Message Passing Interface (MPI) communications between the computational SMP nodes and inside the SMP nodes. The paper reported reasonable speed-up on the systems with up to 8 CPUs and fast deterioration of the performance after that limit due to increased communication cost.

Another approach described in U.S. Pat. No. 7,526,418 considers three-dimensional distorted rectangular grids on which the reservoir simulation problem is solved in time. The method is claimed to work on a variety of computer platforms, such as shared-memory computers, distributed memory computers, or personal computer clusters. The approach heavily depends on the assumption of a structured rectangular grid. It splits a computational domain along the x-axis (east-west axis) and distributes the split parts into separate computational nodes using MPI parallelization to exchange the data between those nodes. Inside the nodes, the approach implements OpenMP parallelization along the y-axis (north-south axis). The method described in that patent cannot be applied to the reservoir simulation models defined on 2.5D grids or unstructured grids.

The approach described in U.S. Patent Publication 2006/0235667 can be applied to a structured grid, a 2.5D grid, or the combination of both as long as the resulting grid has layered structure. The method is claimed to work on a variety of computer platforms, such as shared-memory computers, distributed memory computers, or personal computer clusters. The approach heavily depends on the assumption of layered structure of the underlying grid. It splits the computational domain laterally into vertical columns and distributes the split parts into separate computational nodes using MPI parallelization to exchange the data between those nodes. Inside the nodes, the approach can implement OpenMP parallelization. The method described in that patent application cannot be applied to the reservoir simulation models defined on general unstructured grids or use any other type of partitioning of the grid cells between the computational nodes.

All of the reservoir simulation approaches described above employ static partitioning of computational load between computational nodes. However, the variability of complex geologic structures present in real hydrocarbon reservoirs may require consideration of unstructured grids in the presence of heterogeneities in the problem physics and characterization of the hydrocarbon fluids. Different parts of the simulation may require different computational efforts with dynamically changing computation imbalance and data access behavior. Accordingly, a flexible programming model that achieves better efficiency in distributing the computational load of a reservoir simulation may be desirable.

SUMMARY

Exemplary embodiments of the present invention provide techniques for distributing the workload of a simulation model among processors in a computing cluster. An exemplary embodiment provides a method for executing a reservoir simulation that include generating a representation of a simulation model in a non-transitory, computer readable medium. The method may also include generating a plurality of computational tasks based, at least in part, on the simulation model. The method may also include allocating the computational tasks among a plurality of computational nodes, wherein each processing node of the plurality of computational nodes includes a plurality of core processors and a shared memory accessible by the plurality of core processors. The method may also include executing the reservoir simulation on the plurality of computational nodes. The method may also include, during the reservoir simulation, if a first processing node in the plurality of computational nodes finishes executing its allocated computational tasks, sending a migration request from the first processing node to another processing node in the plurality of computational nodes. The migration request may be configured to request migration of a movable task from the other processing node to the first processing node. The method may also include migrating the movable task from the other processing node to the first processing node.

In some embodiments, executing the reservoir simulation on the plurality of computational nodes includes generating a master thread on each of the computational nodes, the master thread generating one or more working threads configured to receive computational tasks from a task collection stored in the shared memory in each of the computational nodes. Executing the reservoir simulation on the plurality of computational nodes may also include the master thread generating a communication thread configured to handle communications between the plurality of computational nodes. In some embodiments, the method also includes identifying computational tasks allocated to each processing node as movable based, at least in part, on an added communications overhead of the task migration and a benefit of increased processing node utilization.

In some embodiments, sending a migration request to another processing node includes a master thread of the first processing node generating a communication task corresponding to the task migration request and storing the communication task to a task collection of the first processing node. Sending a migration request to another processing node may also include a communication thread of the first processing node receiving the communication task from the task collection and sending the corresponding task migration request to the other processing node.

In some embodiments, sending a migration request to another processing node also includes a master thread of the first processing node generating the task migration request and sending the task migration request to the other processing node. In some embodiments, the method also includes each of the computational nodes generating a task collection and one or more working threads, wherein the working threads receive tasks from the task collection and create new tasks to send to the task collection.

Another exemplary embodiment provides a system for modeling reservoir properties that includes a storage medium comprising a representation of a reservoir model. The system may also include a plurality of computational nodes operatively coupled by a communications network, each processing node of the plurality of computational nodes comprising a plurality of core processors and a shared memory accessible to the plurality of core processors. The system may also include a machine readable medium comprising code configured to assign computational tasks to the plurality of computational nodes for the execution of a reservoir simulation based, at least in part, on the reservoir model. A processing node in the plurality of computational nodes can include code configured to execute the computational tasks assigned to the processing node. The processing node can also include code configured to send a migration request from the processing node to another processing node in the plurality of computational nodes if the processing node finishes executing its allocated computational tasks. The migration request can be configured to request migration of a movable task from the other processing node to the requesting processing node. The processing node can also include code configured to receive the movable task from the other processing node.

In some embodiments, a master thread of the processing node is configured to generate a task collection stored to the shared memory and a working thread configured to receive tasks from the task collection and send tasks to the task collection. In some embodiments, the processing node is configured to handle multi-threaded communications, wherein the master thread and the working thread are configured to send data to other computational nodes over the network.

In some embodiments, the master thread of the processing node is configured to generate a communication thread configured to handle single-threaded communications between the computational nodes. The working thread of the processing node may generate a communication task that includes corresponding data to be transmitted to another processing node and store the communication task to the task collection. The communication thread may receive the communication task from the task collection and send the corresponding data to the other processing node.

In some embodiments, the processing node comprises code configured to identifying computational tasks allocated to the processing node as movable based, at least in part, on an added communications overhead of the task migration and a benefit of increased processing node utilization. In some embodiments, the processing node is configured to send a task migration request to other computational nodes in the plurality of computational nodes if the processing node finishes executing it assigned computational tasks. The processing node may also receive new tasks from the other computational nodes that respond positively and add the new tasks to the task collection of the processing node.

In some embodiments, the master thread of the processing node is configured to generate a communication task corresponding to a task migration request and store the communication task to the task collection of the processing node. A communication thread of the processing node may be configured to receive the communication task from the task collection and send the corresponding task migration request to another processing node over the network. In some embodiments, the master thread of the processing node is configured to generating a task migration request if the processing node finishes executing its assigned computational tasks and send the task migration request to the other processing node.

Another exemplary embodiment provides a non-transitory, computer readable medium comprising code configured to direct a processor to generate one or more working threads configured to perform a set of computational tasks corresponding to a reservoir simulation. The non-transitory, computer readable medium may also include code configured to direct the processor to generate a task collection configured to hold the set of computational tasks, wherein the working threads are configured to receive computational tasks from the task collection and send new tasks to the task collection. The non-transitory, computer readable medium may also include code configured to direct the processor to send a migration request to another processing node if the working threads finish executing the computational tasks in the task collection. The migration request may be configured to request migration of a movable task from the other processing node. The non-transitory, computer readable medium may also include code configured to direct the processor to receive a movable task from the other processing node and add the movable task to the task collection.

In some embodiments, the non-transitory, computer readable medium includes code configured to direct the processor to generate a communication thread configured to handle communications with other computational nodes. In some embodiments, the non-transitory, computer readable medium includes code configured to direct the processor to generate a communication task corresponding to the task migration request and store the communication task to the task collection. The communication thread may be configured to receive the communication task from the task collection and send the corresponding task migration request to another processing node over a network.

In some embodiments, the communication thread may be configured to receive the movable task from the other processing node, store the movable task to a shared memory, and alert a master thread regarding the existence of the movable task. The master thread may be configured to store the movable task to the task collection. In some embodiments, the non-transitory, computer readable medium includes code configured to direct the processor to identify computational tasks in the task collection as movable based, at least in part, on heuristics that consider an added communications overhead of the task migration and a benefit of increased processing node utilization.

DESCRIPTION OF THE DRAWINGS

The advantages of the present techniques are better understood by referring to the following detailed description and the attached drawings, in which.

DETAILED DESCRIPTION

Figure 1:
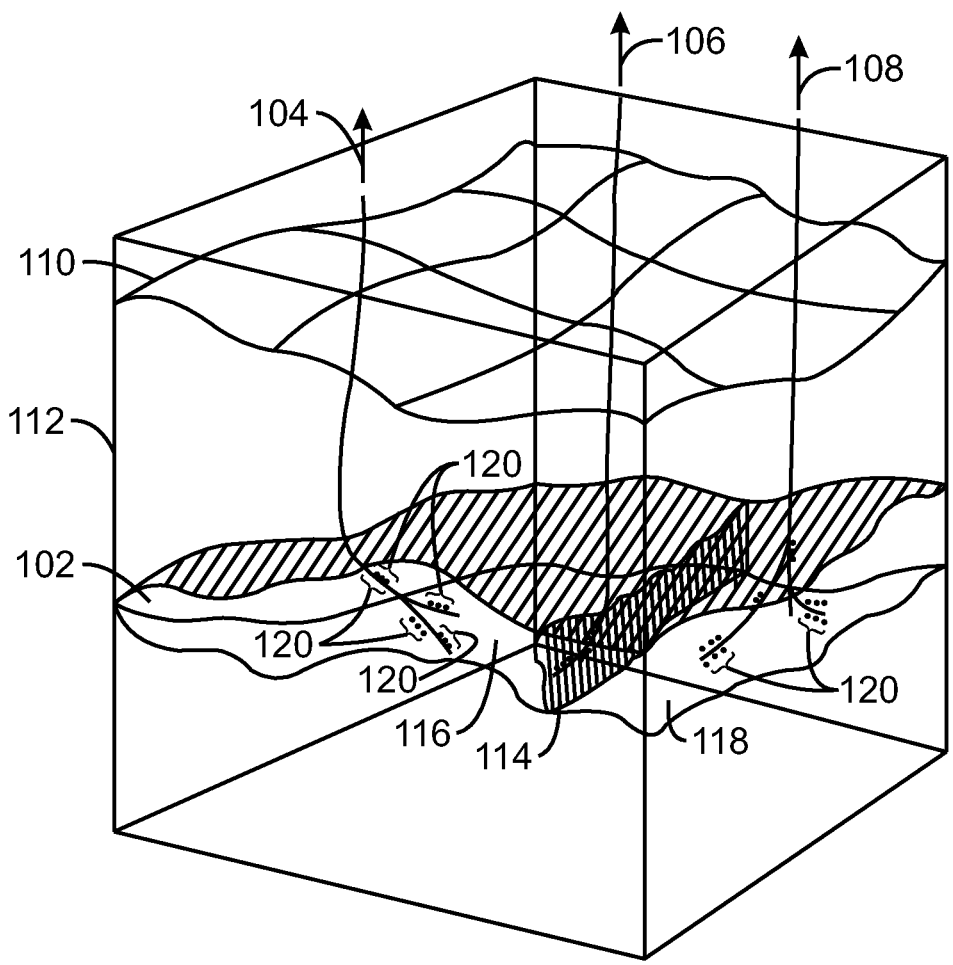
FIG. 1 is a schematic view of a reservoir, in accordance with an exemplary embodiment of the present techniques.

In the following detailed description section, the specific embodiments of the present techniques are described in connection with preferred embodiments. However, to the extent that the following description is specific to a particular embodiment or a particular use of the present techniques, this is intended to be for exemplary purposes only and simply provides a description of the exemplary embodiments. Accordingly, the present techniques are not limited to the specific embodiments described below, but rather, such techniques include all alternatives, modifications, and equivalents falling within the true spirit and scope of the appended claims.

At the outset, and for ease of reference, certain terms used in this application and their meanings as used in this context are set forth. To the extent a term used herein is not defined below, it should be given the broadest definition persons in the pertinent art have given that term as reflected in at least one printed publication or issued patent. Further, the present techniques are not limited by the usage of the terms shown below, as all equivalents, synonyms, new developments, and terms or techniques that serve the same or a similar purpose are considered to be within the scope of the present claims.

"Coarsening" refers to reducing the number of cells in simulation models by making the cells larger, for example, representing a larger space in a reservoir. Coarsening is often used to lower the computational costs by decreasing the number of cells in a geologic model prior to generating or running simulation models.

"Computer-readable medium" or "non-transitory, computer-readable medium" as used herein refers to any tangible storage and/or transmission medium that participates in providing instructions to a processor for execution. Such a medium may include, but is not limited to, non-volatile media and volatile media. Non-volatile media includes, for example, NVRAM, or magnetic or optical disks. Volatile media includes dynamic memory, such as main memory. Common forms of computer-readable media include, for example, a floppy disk, a flexible disk, a hard disk, an array of hard disks, a magnetic tape, or any other magnetic medium, magneto-optical medium, a CD-ROM, a holographic medium, any other optical medium, a RAM, a PROM, and EPROM, a FLASH-EPROM, a solid state medium like a memory card, any other memory chip or cartridge, or any other tangible medium from which a computer can read data or instructions.

As used herein, "to display" or "displaying" includes a direct act that causes displaying, as well as any indirect act that facilitates displaying. Indirect acts include providing software to an end user, maintaining a website through which a user is enabled to affect a display, hyperlinking to such a website, or cooperating or partnering with an entity who performs such direct or indirect acts. Thus, a first party may operate alone or in cooperation with a third party vendor to enable the reference signal to be generated on a display device. The display device may include any device suitable for displaying the reference image, such as without limitation a CRT monitor, a LCD monitor, a plasma device, a flat panel device, or printer. The display device may include a device which has been calibrated through the use of any conventional software intended to be used in evaluating, correcting, and/or improving display results (for example, a color monitor that has been adjusted using monitor calibration software). Rather than (or in addition to) displaying the reference image on a display device, a method, consistent with the invention, may include providing a reference image to a subject. "Providing a reference image" may include creating or distributing the reference image to the subject by physical, telephonic, or electronic delivery, providing access over a network to the reference, or creating or distributing software to the subject configured to run on the subject's workstation or computer including the reference image. In one example, the providing of the reference image could involve enabling the subject to obtain the reference image in hard copy form via a printer. For example, information, software, and/or instructions could be transmitted (for example, electronically or physically via a data storage device or hard copy) and/or otherwise made available (for example, via a network) in order to facilitate the subject using a printer to print a hard copy form of reference image. In such an example, the printer may be a printer which has been calibrated through the use of any conventional software intended to be used in evaluating, correcting, and/or improving printing results (for example, a color printer that has been adjusted using color correction software).

"Exemplary" is used exclusively herein to mean "serving as an example, instance, or illustration." Any embodiment described herein as "exemplary" is not to be construed as preferred or advantageous over other embodiments.

"Flow simulation" is defined as a numerical method of simulating the transport of mass (typically fluids, such as oil, water and gas), energy, and momentum through a physical system using a computer. The physical system includes a three dimensional reservoir model, fluid properties, the number and locations of wells. Flow simulations also require a strategy (often called a well-management strategy) for controlling injection and production rates. These strategies are typically used to maintain reservoir pressure by replacing produced fluids with injected fluids (for example, water and/or gas). When a flow simulation correctly recreates a past reservoir performance, it is said to be "history matched," and a higher degree of confidence is placed in its ability to predict the future fluid behavior in the reservoir.

"Permeability" is the capacity of a rock to transmit fluids through the interconnected pore spaces of the rock. Permeability may be measured using Darcy's Law: $Q=(k \Delta P A)/(\mu L)$, wherein Q=flow rate (cm3/s), $\Delta P$=pressure drop (atm) across a cylinder having a length L (cm) and a cross-sectional area A (cm2), $\mu$=fluid viscosity (cp), and k=permeability (Darcy). The customary unit of measurement for permeability is the millidarcy. The term "relatively permeable" is defined, with respect to formations or portions thereof, as an average permeability of 10 millidarcy or more (for example, 10 or 100 millidarcy). The term "relatively low permeability" is defined, with respect to formations or portions thereof, as an average permeability of less than about 10 millidarcy. An impermeable layer generally has a permeability of less than about 0.1 millidarcy.

"Pore volume" or "porosity" is defined as the ratio of the volume of pore space to the total bulk volume of the material expressed in percent. Porosity is a measure of the reservoir rock's storage capacity for fluids. Porosity is preferably determined from cores, sonic logs, density logs, neutron logs or resistivity logs. Total or absolute porosity includes all the pore spaces, whereas effective porosity includes only the interconnected pores and corresponds to the pore volume available for depletion.

"Reservoir" or "reservoir formations" are typically pay zones (for example, hydrocarbon producing zones) that include sandstone, limestone, chalk, coal and some types of shale. Pay zones can vary in thickness from less than one foot (0.3048 m) to hundreds of feet (hundreds of m). The permeability of the reservoir formation provides the potential for production.

"Reservoir properties" and "reservoir property values" are defined as quantities representing physical attributes of rocks containing reservoir fluids. The term "reservoir properties" as used in this application includes both measurable and descriptive attributes. Examples of measurable reservoir property values include porosity, permeability, water saturation, and fracture density. Examples of descriptive reservoir property values include facies, lithology (for example, sandstone or carbonate), and environment-of-deposition (EOD). Reservoir properties may be populated into a reservoir framework to generate a reservoir model.

"Simulation model" refers to a specific mathematical representation of a real hydrocarbon reservoir, which may be considered to be a particular type of geologic model. Simulation models are used to conduct numerical experiments (reservoir simulations) regarding future performance of the field with the goal of determining the most profitable operating strategy. An engineer managing a hydrocarbon reservoir may create many different simulation models, possibly with varying degrees of complexity, in order to quantify the past performance of the reservoir and predict its future performance.

"Transmissibility" refers to the volumetric flow rate between two points at unit viscosity for a given pressure-drop. Transmissibility is a useful measure of connectivity. Transmissibility between any two compartments in a reservoir (fault blocks or geologic zones), or between the well and the reservoir (or particular geologic zones), or between injectors and producers, can all be useful for understanding connectivity in the reservoir.

"Well" or "wellbore" includes cased, cased and cemented, or open-hole wellbores, and may be any type of well, including, but not limited to, a producing well, an experimental well, an exploratory well, and the like. Wellbores may be vertical, horizontal, any angle between vertical and horizontal, deviated or non-deviated, and combinations thereof, for example a vertical well with a non-vertical component. Wellbores are typically drilled and then completed by positioning a casing string within the wellbore. Conventionally, the casing string is cemented to the well face by circulating cement into the annulus defined between the outer surface of the casing string and the wellbore face. The casing string, once embedded in cement within the well, is then perforated to allow fluid communication between the inside and outside of the tubulars across intervals of interest. The perforations allow for the flow of treating chemicals (or substances) from the inside of the casing string into the surrounding formations in order to stimulate the production or injection of fluids. Later, the perforations are used to receive the flow of hydrocarbons from the formations so that they may be delivered through the casing string to the surface, or to allow the continued injection of fluids for reservoir management or disposal purposes.

Overview

Exemplary embodiments of the present techniques disclose methods and systems for distributing reservoir simulation workflow among computing units, such as individual computer systems, computing units in a computer cluster, and the like. A property of at least one fluid in a fluid-containing physical system may be simulated using a multiplicity of volumetric cells and a multiplicity of connections between cells. The computing system may include clusters of symmetric multiprocessor (SMP) nodes coupled together via a communications network, wherein each SMP node includes a shared memory that may be accessed by one or more processors, or cores. Simulation algorithms executing on the SMP nodes may be realized by sets of communicating thread groups. Within each SMP node, the thread groups may communicate using the shared memory. Various message-passing techniques may be used to transfer data between the SMP nodes through the network. Furthermore, dynamic load balancing between the SMP nodes may be achieved by transferring computational tasks between threads of different SMP nodes during the simulation. For example, if a thread finishes the tasks originally assigned to it, the thread may request additional tasks from other SMP nodes.

Embodiments of the present inventions may be better understood with reference to the following Figures. An overview of an exemplary reservoir simulation technique is described with reference to FIGS. 1, 2, and 3. An exemplary computing system is described with reference to FIGS. 4 and 5. Exemplary message-passing techniques are described in reference to FIGS. 6, 7, 8, and 9. Exemplary task migration techniques are described in reference to FIGS. 10 and 11.

FIG. 1 is a schematic view 100 of a reservoir 102, in accordance with an exemplary embodiment of the present techniques. The reservoir 102, such as an oil or natural gas reservoir, can be a subsurface formation that may be accessed by drilling wells 104, 106, and 108 from the surface 110 through layers of overburden 112. The reservoir 102 may have one or more faults 114 dividing areas, for example regions 116 and 118, and which may either restrict or enhance the flow of hydrocarbons. The wells 104, 106, and 108 may be deviated, such as being directionally drilled to follow the reservoir 102. Further, the wells can be branched to increase the amount of hydrocarbon that may be drained from the reservoir, as shown for wells 104 and 108. The wells 104, 106, and 108, can have numerous areas with perforations 120 (indicated as dots next to the wells) to allow hydrocarbons to flow from the reservoir 102 into the wells 104, 106, and 108 for removal to the surface.

A simulation model, or simulator, of the reservoir 102 is likely to find that the greatest changes occur in the vicinity of the wells 104, 106, and 108, and other reservoir features, such as the fault 114. Accordingly, it would be useful to keep areas in the vicinity of each of these features in single computational subdomains. A partition between computational subdomains that crosses a well 104, 106, and 108, fault 114, or other feature may slow convergence of the simulation, increase computational loading by increasing communication between computing units, or even prevent convergence, resulting in a failure to find a solution.

Figure 2:
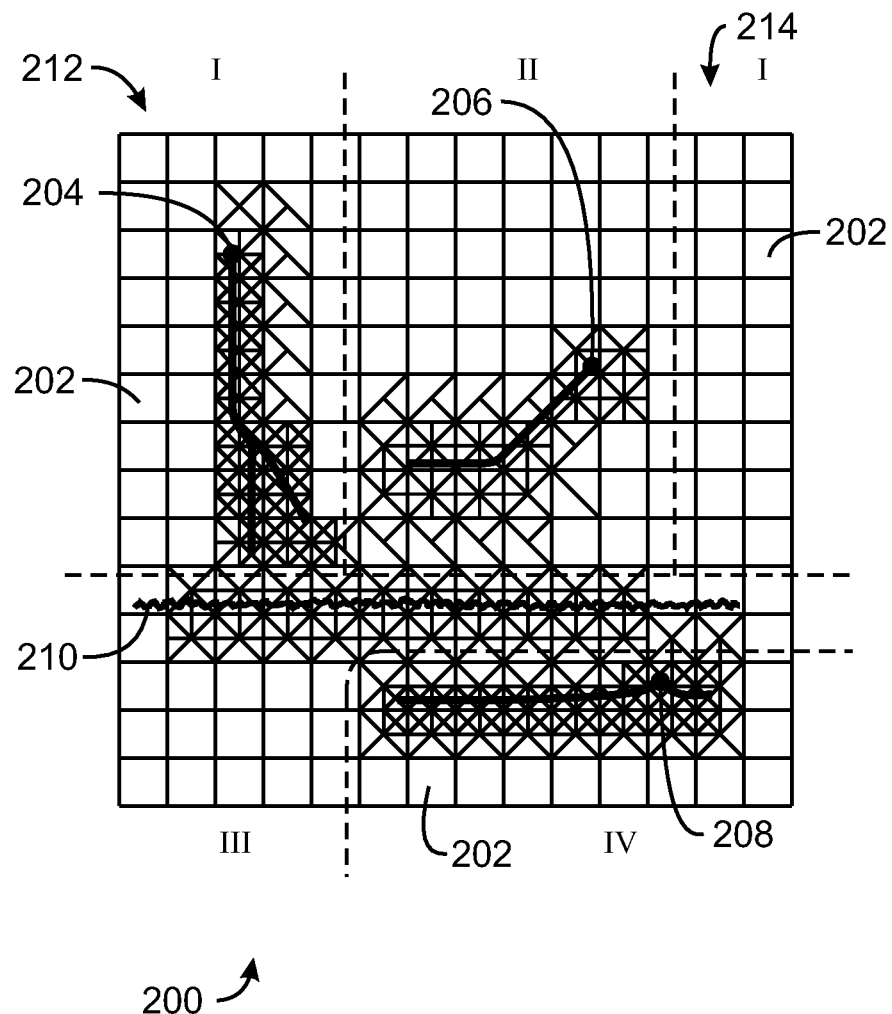
FIG. 2 is a top view of a reservoir showing a planar projection of a computational mesh over the reservoir, in accordance with an exemplary embodiment of the present techniques.

FIG. 2 is a top view of a reservoir showing a planar projection of a computational mesh 200 over the reservoir, in accordance with an exemplary embodiment of the present techniques. Although the computational mesh 200 is shown as a two dimensional grid of computational cells (or blocks) 202 to simplify the explanation of the problem, it should be understood that the actual computational mesh 200 can be a three dimension matrix of computational cells 202 that encompasses the reservoir. A computational cell 202 is a single two or three dimensional location within a simulation model that represents a physical location in a reservoir. The computational cell 202 may have associated properties, such as porosity or an oil content, which is assumed to be a single value over the entire computational cell 202 and is assigned to the center of the computational cell 202. Computational cells 202 may interact with adjacent computational cells 202, for example, by having flux properties assigned to a shared border with the adjacent computational cells 202. For example, the flux properties may include heat or mass transfer values.

The computational mesh 200 can be coarsened in areas that may have less significant changes, for example, by combining computational cells 202 that are not in proximity to a well or other reservoir feature. Similarly, the computational mesh 200 may retain a fine mesh structure in the vicinity of wells or other reservoir features, such as a first well 204, a second well 206, a third well 208, a fault 210, or any other features that may show larger changes than other areas.

The computational mesh 200 represents the simulation model, and can be divided among computing units to decrease the amount of time needed to provide a result for the simulation. This procedure may be termed "parallelization." The parallelization of the simulation model is realized by parallelizing the individual components at each time step. To achieve efficient utilization of the parallel computing units the simulation model can be distributed across the computing units so that the computational load is evenly balanced and the amount of inter-unit communication is minimized. This division may be performed by generating an initial partitioning of the simulation model, i.e., assigning different computational cells 202 in the computational mesh 200 to different computing units (such as described with respect to FIG. 4). Each computational cell 202 may require a different approach to parallelization based on the numerical formulation, the actual input data, the computational task, and user supplied options. Furthermore, during the execution of the simulation, for example, during each time step, the computational load between the computing units may be redistributed through task migration, as described below in relation to FIGS. 10 and 11.

In the exemplary embodiment shown in FIG. 2, the computational mesh 200 is initially partitioned between four computing units, as indicated by the subdomains labeled I-IV. Although four computing units are used in FIG. 2, any number of computing units may be used in other embodiments, depending on the size of the simulation model and the number of near well features. For example, a small simulation model may provide results in a reasonable timeframe from a single computing device, while a large simulation may use 10, 100, 1000, or even more computing units for the parallelization.

Further, while the subdomains I-IV do not cross near well regions or significant reservoir features, the subdomains are not limited to contiguous areas, but may include non-contiguous areas, which may be useful for balancing the load between the computing units. For example, as illustrated in FIG. 2, subdomain I may be divided into two regions. A first region 212 encompasses the near well region for the first well 204, while a second region 214 encompasses a number of larger computational cells 202 that may have less significant changes than the near well regions.

Workflow for Modeling a Reservoir

In order to analyze a phenomenon changing in time, it is necessary to calculate physical quantities at discrete intervals of time called time steps, irrespective of the continuously changing conditions as a function of time. Time-dependent modeling of the transport processes therefore proceeds in a sequence of time steps. During a time step, transport of various kinds occurs between cells. Through this transport, a cell can exchange mass, momentum, or energy with a nearby cell.

The equations governing the behavior of each cell during a time step couple the mass, momentum, and energy conservation principles to the transport equations. At every time step the simulator must solve one or more large matrix equations, with the number of unknowns depending on the type of time step computation method being used. Because matrix equations are quite large, having at least one equation per cell, they are solved iteratively except in the case of small models.

Various time step computations may be used for the reservoir simulation. In exemplary embodiments, an implicit-pressure, explicit-saturation (IMPES) computations may be used. In the IMPES computation, flows between neighboring cells are computed based on pressures at their centers at the end of each time step. The pressures at the end of the IMPES time step are interdependent and are determined simultaneously. This method is called "implicit" because each pressure depends on other quantities that are known implicitly. The basic procedure is to form a matrix equation that is implicit in pressures, solve this matrix equation for the pressures, and then use these pressures in computing saturations explicitly cell by cell. In this fashion, after the pressures have been advanced in time, the saturations are updated explicitly. After the saturations are calculated, updated physical properties such as relative permeabilities and capillary pressures can be calculated and used explicitly at the next time step. Similar treatment can be used for other possible solution variables such as concentrations, component masses, temperature, or internal energy.

The fully implicit method treats both pressure and saturations implicitly. Flow rates may be computed using phase pressures and saturations at the end of each time step. The calculation of flow rates, pressures, and saturations involves the solution of nonlinear equations using a suitable iterative technique. At each iteration, a matrix equation may be constructed and solved, the unknowns of which (pressure and saturations) change over the iteration. The matrix of this matrix equation is often called "Jacobian." As the pressures and saturations are solved, the updating of these terms continues using new values of pressure and saturation. The iteration process terminates when predetermined convergence criteria are satisfied. Techniques for modeling a reservoir may be better understood with reference to FIG. 3.

Figure 3:
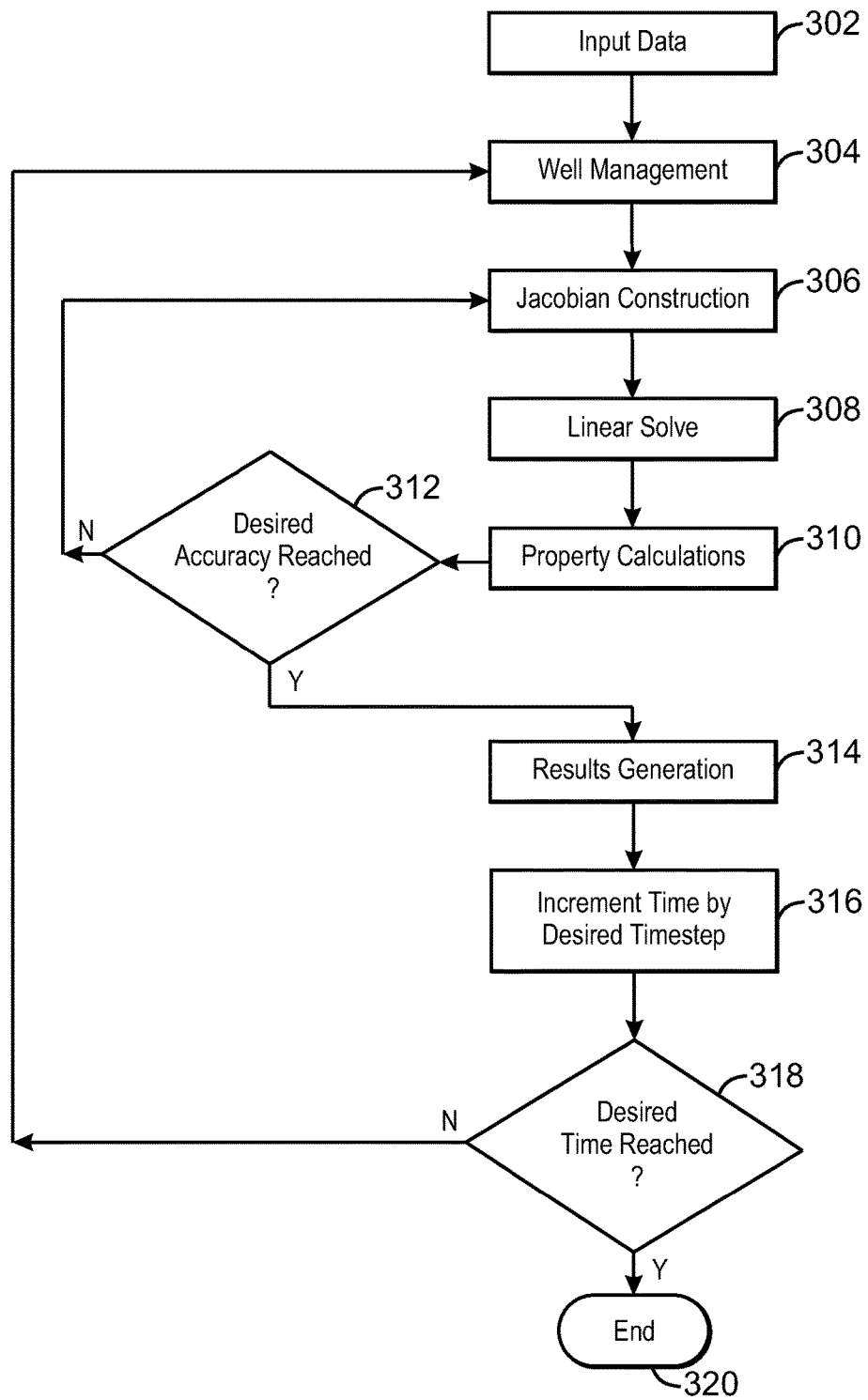
FIG. 3 is a process flow diagram of a workflow for modeling a reservoir, in accordance with an exemplary embodiment of the present techniques.

FIG. 3 is a process flow diagram of a workflow 300 for modeling a reservoir, in accordance with an exemplary embodiment of the present techniques. Although the discretization (coarsening) and the level of implicitness (which state variables, such as pressure or saturation, are treated implicitly or explicitly in the formulation) of the solution process varies, simulation models may perform in a similar fashion as workflow 300. A simulation model can begin at block 302 by parsing user input data. The input data may include the problem formulation, a geologic model that is discretized into grid blocks with physical properties defined at each grid block, including rock properties (such as permeability or transmissibility) and fluid properties (such as density or viscosity). At block 304, a well management routine computes the current state of surface facilities and wells from the governing equations. At block 306 the values from the well management routine are used along with the value of state variables at each computational cell to construct a Jacobian matrix. The Jacobian matrix is the matrix (or array) of all first order partial derivatives (with respect to the state variables) of a vector valued function. In reservoir simulation, the Jacobian details the change of the governing partial differential equations with respect to the state variables (pressure, saturation).

At block 308 the linear solver uses the Jacobian matrix to generate updates for physical properties of interest, such as pressure and saturation, among others. At block 310 the calculated physical properties are compared to either previously calculated properties or to measured properties, and at block 312 a determination is made as to whether a desired accuracy has been reached. In an exemplary embodiment, the determination is made by determining that the calculated properties have not significantly changed since the last iteration (which may indicate convergence). For example, convergence may be indicated if the currently calculated properties are within 0.01%, 0.1%, 1%, 10%, or more of the previously calculated properties. In other embodiments, the determination may be determining if the calculated properties are sufficiently close to measured properties, for example, within 0.01%, 0.1%, 1%, 10%, or more. If the desired accuracy is not reached, process flow returns to block 306 to perform another iteration of the linear solver.

If at block 312 the desired accuracy has been reached, process flow proceeds to block 314, at which results are generated. The results may be stored in a data structure on a non-transitory machine readable medium such as a database for later presentation, or the results may be immediately displayed or printed after generation. At block 316 the time is incremented by a desired time step, for example, a day, a week, a month, a year, 5 years, 10 years or more, depending at least in part on the desired length of time for the simulation. At block 318 the new time is compared to the length desired for the simulation. If the simulation has reached the desired length of time, the simulation ends at block 320. If the time has not reached the desired length, flow returns to block 304 to continue with the next increment.

In exemplary embodiments, the computational processes involved in the simulation may be parallelized to provide proper load balancing between computing units. An initial partitioning of the computational operations may be determined as a first approximation regarding the proper load balance. During the simulation, tasks may be migrated between computing units to improve the load balance. The parallelization of the processes may be considered to fall into two main types: task based parallelization and grid based parallelization. For task based parallelization, a calculation is divided into sub tasks that are run independently in parallel. For example, in the well management task at block 304, a set of operations may be computed on each of a set of wells that can be performed independently of one another. Therefore each computing unit may execute the operations independently of the other computing units.

Grid based parallelization may be performed at a number of points in the processes, such as in the Jacobian construction and/or the property calculations discussed with respect to blocks 306 and 310. In the computational process of constructing the Jacobian, rock and fluid properties with corresponding derivatives are calculated at each computational cell. This type of parallelization is used for computations that do not depend on the computational cells being adjacent or require global communication for the computations.

Vapor-liquid equilibrium (VLE) fluid property computations may be considered in an example of parallelization. If a simulation model uses a black oil fluid characterization for VLE computations, the amount of computational work required for a flash calculation is roughly proportional to the number of computational cells due to the linear nature of the black oil VLE computations. However, if a compositional fluid model is chosen, the amount of computational work for the flash calculation within a single computational cell depends on the cell's position in the phase state space. Hence, the amount of computational work may vary sharply from cell to cell.

Grid based parallelization may also be used to divide the problems used by the linear solver among computing units. The linear solver is an algorithm used to compute updates to state properties (pressure, saturation, etc). A linear solver requires local computations that are similar between subdomains, in other words, the computational cells associated with each computing unit. However, linear solvers also require global computations (which are not required for Jacobian construction) to compute updates to the state variables of interest.

System Configuration

Figure 4:
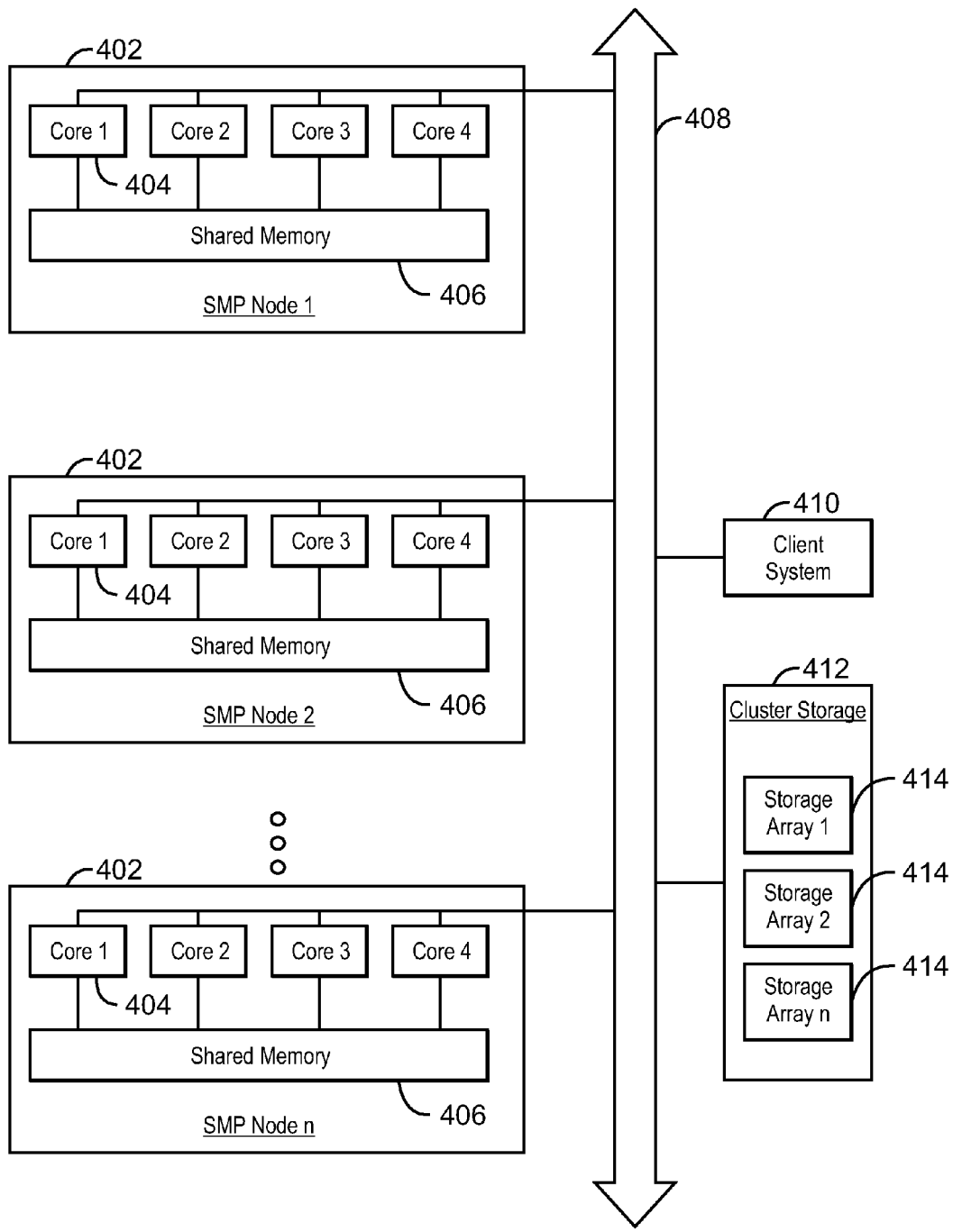
FIG. 4 is block diagram of an exemplary cluster computing system that may be used in accordance with exemplary embodiments of the present techniques.

FIG. 4 is block diagram of an exemplary cluster computing system 400 that may be used in accordance with exemplary embodiments of the present techniques. The cluster computing system 400 may have any suitable number of computational nodes, referred to herein as "SMP nodes" 402, each of which may perform calculations for part of the simulation model. For example, a small simulation model may be run on a single SMP node 402, while a large simulation model may be run on a cluster computing system 400 having 10, 100, 1000, or even more SMP nodes 402. Each SMP node 402 may have multiple processors, or cores 404. Although the SMP nodes 402 shown in FIG. 4 have four cores 404, one of ordinary skill in the art will recognize that the present techniques are not limited to this configuration, as each SMP node 402 may have any suitable number of cores 404, for example, 1, 2, 4, 8, or more. The cores 404 included in each of the SMP nodes 402 may be coupled to a shared memory 406, which may include random access memory (RAM) and/or read-only memory (ROM). The shared memory 406 may be configured for Uniform Memory Access (UMA), Non-Uniform Memory Access (NUMA), and the like. The cores 404 may also use shared or separate caches. The shared memory 406 may be used to store code, for example, used to direct the cores 404 to implement the methods described herein. The shared memory 406 may be used to store computational results computed during the reservoir simulation. Additionally, the particular organization of computational nodes, including the number of cores, the memory access architecture 404, cache organization, and the like, may differ from one SMP node 402 to another.

The cluster computing system 400 may also include a network 408, such as a high speed network that includes one or more communications busses. The network 408 may be used to communicate instructions and computational data between each of the SMP nodes 402 of the cluster computing system 400 during the reservoir simulation. For example, a global parameter such as a maximum fluid pressure over the entire simulation model, which has been computed by one SMP node 402, may be communicated to the other SMP nodes 402. Additionally, boundary conditions and state variables such as flow rates, pressures, and saturations computed by one SMP node 402, may be passed to another SMP node 402 corresponding to an adjacent cell of the reservoir simulation. The SMP nodes 402 may also migrate computational tasks from one SMP node 402 to another through the network 408.

The cluster computing system 400 may also include one or more client systems 410 communicatively coupled to the network 408, such as general-purpose computers, workstations, and the like. Each of the client systems 410 may have non-transitory, computer readable memory for the storage of operating code and programs, including random access memory (RAM) and read only memory (ROM). The operating code and programs may include the code used to implement all or portions of the reservoir simulation. The client systems 410 can also have other non-transitory computer readable media such as storage systems for storage of operating code, reservoir models, reservoir simulation results, visual representations, and other information used for implementing the methods described herein. The storage systems may include one or more hard drives, one or more optical drives, one or more flash drives, any combinations of these units, or any other suitable storage device. Further, each of the client systems 410 may also have multiple processor cores 404 and may be configured to function as an SMP node 402 in the cluster computing system 400.

The cluster computing system 400 may also include cluster storage 412. The cluster storage 412 can have one or more non-transitory computer readable media devices such as storage arrays 414 for the storage of data, reservoir simulation results, visual representations, code, or other information, for example, concerning the implementation of and results from the reservoir simulation. The storage arrays 414 may include any combinations of hard drives, optical drives, flash drives, holographic storage arrays, or any other suitable devices.

The present techniques are not limited to the architecture of the cluster computer system 400 illustrated in FIG. 4. For example, any suitable processor-based device may be utilized for implementing all or a portion of embodiments of the present techniques, including without limitation personal computers, laptop computers, computer workstations, GPUs, mobile devices, and multi-processor servers or workstations with (or without) shared memory. Moreover, embodiments may be implemented on application specific integrated circuits (ASICs) or very large scale integrated (VLSI) circuits. In fact, persons of ordinary skill in the art may utilize any number of suitable structures capable of executing logical operations according to the embodiments.

Figure 5:
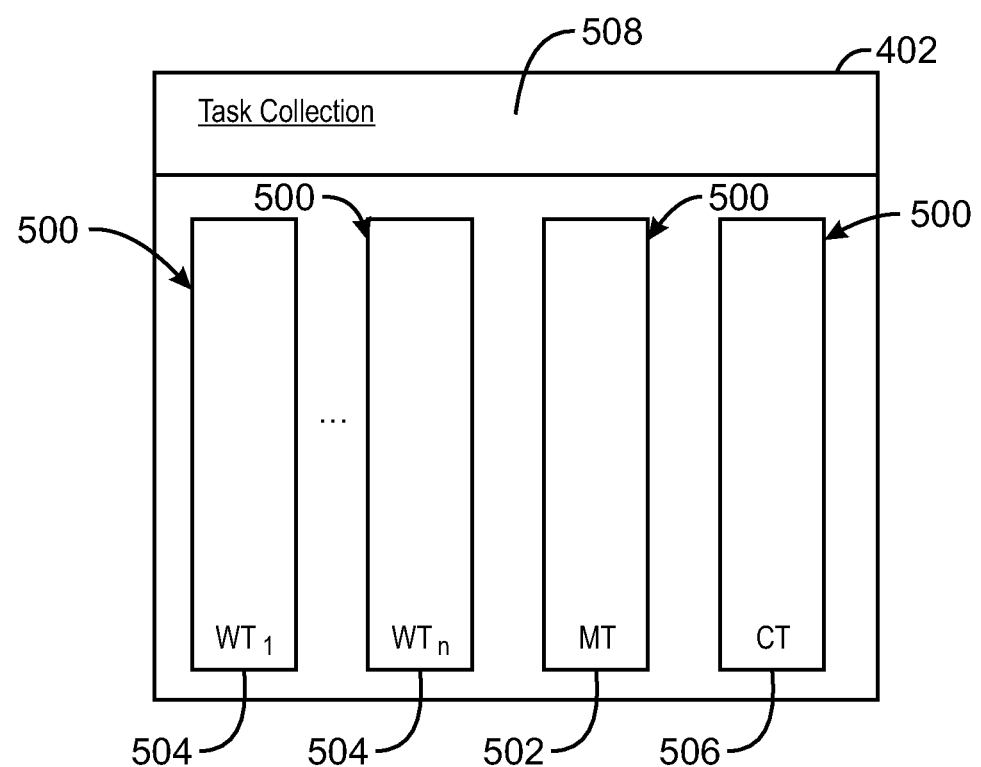
FIG. 5 is a block diagram of an exemplary SMP node in accordance with exemplary embodiments of the present techniques.

FIG. 5 is a block diagram of an exemplary SMP node 402 in accordance with exemplary embodiments of the present techniques. Each SMP node 402 may generate a number of threads of process execution 500, referred to herein as "threads." When the reservoir simulation application starts on an SMP node 402, at least one thread 500 is created at each SMP node 402, which is referred to herein as the master thread (MT) 502. In exemplary embodiments, the master thread 502 handles the parallelization of tasks allocated to the SMP node 402 and generates other threads 500. For example, the master thread 502 may create a number of working threads (WT) 504 up to the number of the cores 404 available to the reservoir simulation application on the SMP node 402. In embodiments, multiple threads can execute on a single core 404. The working threads 504 are organized into a working thread group, one for each SMP node 402. Depending on the hardware organization, capabilities of the communication software, or the need of the application, the master thread 502 of each SMP node 402 may also create a separate communication thread (CT) 506 that manages communications between the SMP node 402 and the other SMP nodes 402 of the cluster computing system 400. However, in embodiments, the master thread can choose to handle communication with other SMP nodes 402 by itself instead of creating the communication thread 506 or even allow some working threads 504 to communicate directly with other SMP nodes 402. All the threads 500 or some part of them, such as working threads 504, can be bound to particular cores 404 (FIG. 4) if the hardware and the underlying operating system are equipped with the possibility to bind threads 500 to the cores 404.

At any stage of the simulation process, the reservoir simulation application may be structured into a set of interacting tasks or jobs. Each task consists of a sequence of computations or commands captured in a function or procedure to be executed by a thread 500. Examples of such computations can be: computation of Jacobian elements, computation of the residual, vector-vector multiplication, and the like. The computations may include the dynamic creation of new tasks which can later be executed by the same or different thread 500. Collections of tasks are organized on each SMP node 402. The tasks can be sent from one SMP node 402 to another SMP node 402 for proper load balancing of the computational workflow.

Each SMP node can also include a task collection 508 used to store and manage the tasks created on the corresponding SMP node 402 or received from other SMP nodes 402 during the simulator execution. The task collection 508 may be stored to a shared memory location, such as the shared memory 406 shown in FIG. 4. In exemplary embodiments, the task collection 508 may be accessible to all threads 500 of the corresponding SMP node 402. Any thread 500 can extract a task from the task collection 508 for execution or insert a new task into the task collection 508. The number of task collections 508 created on an SMP node 402 can be flexible and may be determined by the needs of the computational algorithm. In some embodiments, the SMP node 402 includes a single task collection 508, which is shared by all of the threads 500. The communication of tasks between different threads 500 of an SMP node 402 can be performed using shared address space of the process running on the SMP node 402. A scheduling algorithm may be used to determine the sequence in which the tasks from the task collection 508 should be executed.

In embodiments, thread management within the SMP nodes 402 may be handled by any suitable thread management tool. For example, Windows Threads may be utilized for an SMP node 402 on a Microsoft Windows-compatible operating system, such as XP, Vista, or Windows 7. For an SMP node 402 on a computer with a UNIX or Linux operating system, a Portable Operating System Interface (POSIX) thread library may be utilized. It will be appreciated that embodiments of the present invention may incorporate any thread management tool that provides a sufficient level of heterogeneity to successfully handle the thread management techniques described herein, including thread management tools that may be developed in the future such as any future version of the Open Multi-Processing (OpenMP) application programming interface (version 3.x or above).

Communication between the SMP nodes 402 may be handled by any suitable communications tool that can handle global communications between multiple SMP nodes 402 and local communications between any two SMP nodes 402. In exemplary embodiments, the communications tool may include the Message Passing Interface (MPI) library, including versions 1.4 and later.

The MPI standard defines several levels of threading support, some of which are referred to as "MPI_THREAD_FUNNELED," "MPI_THREAD_SERIALIZED," and "MPI_THREAD_MULTIPLE." Under the MPI_THREAD_FUNNELED threading support level, the MPI process may be multi-threaded, but only one thread, referred to herein as the "main thread," will make MPI calls. In embodiments that use the MPI_THREAD_FUNNELED thread support level, the main thread can be the communication thread 506 and a separate master thread 502 may be created. At the start of simulator execution, the main thread may create the master thread 506 and begin serving as the communications thread 502. The master thread 502 creates the group of working threads 504. The SMP node 402 can then be used for single-threaded communication workflows, as described below in relation to FIGS. 7, 9, and 11. As used herein, the term "single-threaded communication" refers to communications wherein only the communication thread 506 is used to handle communications between nodes 402, including peer-to-peer communication and global communications.

Under the MPI_THREAD_SERIALIZED threading support level, the MPI process may be multi-threaded and multiple threads 500 may make MPI calls one at a time. In other words, MPI calls cannot be made concurrently from two distinct threads 500. In embodiments that use the MPI_THREAD_SERIALIZED thread support level any thread 500 can be used to communicate with other SMP nodes 402. At the start of simulator execution, the main thread becomes the master thread 502. The master thread can create the communication thread 506 and the group of working threads 504. The SMP node 402 can then be used for multi-threaded communication workflows, as described below in relation to FIGS. 6, 8, and 10.

Under the MPI_THREAD_threading support level, multiple threads can make MPI calls concurrently. In embodiments that use the MPI_THREAD_MULTIPLE thread support level, any thread 500 can be used to communicate with other SMP nodes 402. At the start of simulator execution, the main thread becomes the master thread 502. The master thread 502 creates the communication thread 506 and the group of working threads 504. The SMP node 402 can then be used for single-threaded and multi-threaded communication workflows, as described below in relation to FIGS. 6-10. As used herein, the term "multi-threaded communication" refers to communications wherein multiple threads 500 from single SMP node 402 may be used to participate in the communications between nodes 402, including peer-to-peer communication and global communications.

Depending on the computational workflow during the reservoir simulator execution, communications between SMP nodes 402 can be global communications or peer-to-peer communications. In exemplary embodiments, global communications are handled by the communication threads, which can include all-to-all, all-to-one, or one-to-all communication patterns. In all-to-one communications, all SMP nodes 402 send information to one SMP node 402. In one-to-all communications, one SMP node 402 sends information to all of the SMP nodes 402. In all-to-all communications, each SMP node 402 sends information to each of the other SMP nodes 402. Using proper synchronization schemes, such as the locking mechanism of POSIX threads or Windows threads, the communication threads 506 ensure that data is available to be sent or the appropriate memory area is available to accept incoming data. The data may then be exchanged globally using an all-to-all, all-to-one, or one-to-all communication pattern, for example, using the corresponding MPI functionality.

Peer-to-peer communications may include push or pull communication patterns. In both types of communications, the sending thread 500 can be the communication thread 506, the master thread 502 if it is different from the communication thread 506, or any working thread 504 provided the hardware and the communication software allow for multiple threads 500 from a single SMP node 402 to participate in the peer-to-peer communications. If either the hardware or the communication software does not allow for multiple threads 500 from a single SMP node 402 to simultaneously communicate with other SMP nodes 402, then all peer-to-peer communications on any SMP node 402 may be handled by the communication threads 506.

Message Passing

Figure 6:
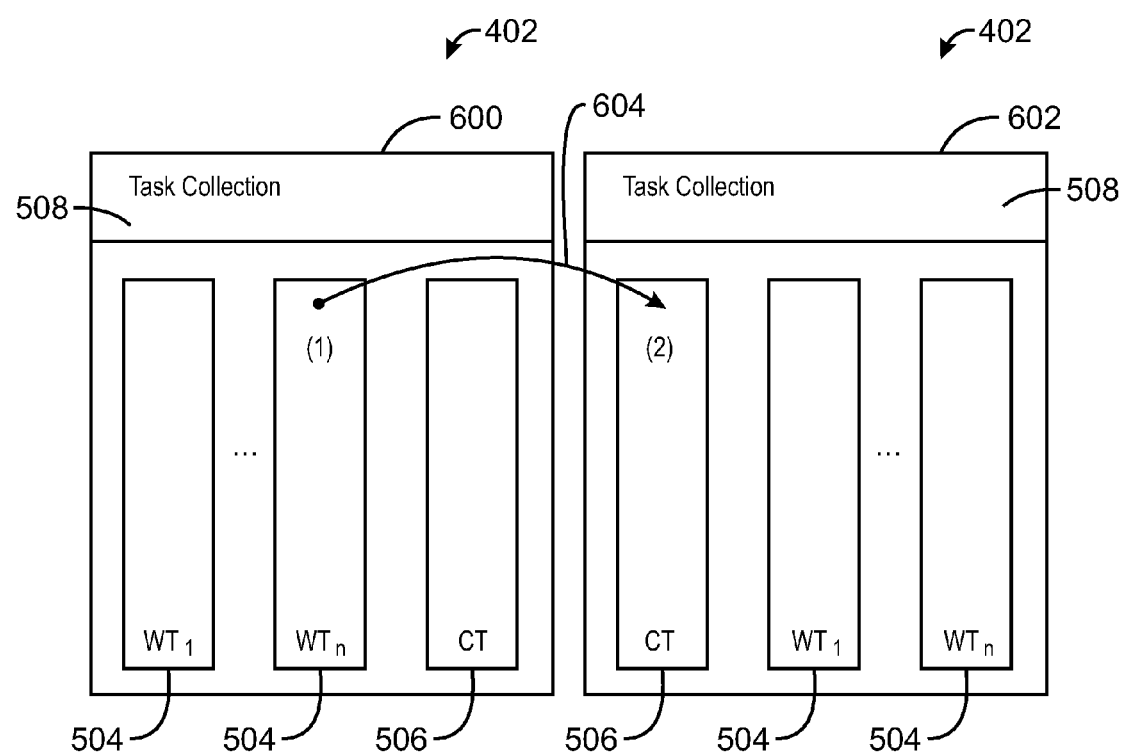
FIG. 6 is an operational diagram of push-type, multi-threaded message passing, in accordance with an exemplary embodiment of the present techniques.

FIG. 6 is an operational diagram of push-type, multi-threaded message passing, in accordance with an exemplary embodiment of the present techniques. In push-type message passing, a thread 500 from one SMP node 402 sends data to another SMP node 402 without having received a request for the data. On the receiving SMP node 402, the communication thread 506 is allowed to receive and process the data from sending SMP node 402. In FIG. 6, the sending SMP node 402 is referred to by the item number 600, and the receiving SMP node 402 is referred to by the item number 602. As shown in FIG. 6, in push-type, multi-threaded communications, one of the threads 500 of the sending node 600 sends data to the communications thread 506 of the receiving node 602, as indicated by arrow 604. The communication thread 506 of the receiving node 602 receives and processes the data. Although FIG. 6 shows a working thread 504 as sending the data, in case of multi-threaded communication, the sending thread 500 can also be the communication thread 506 or the master thread 502.

Figure 7:
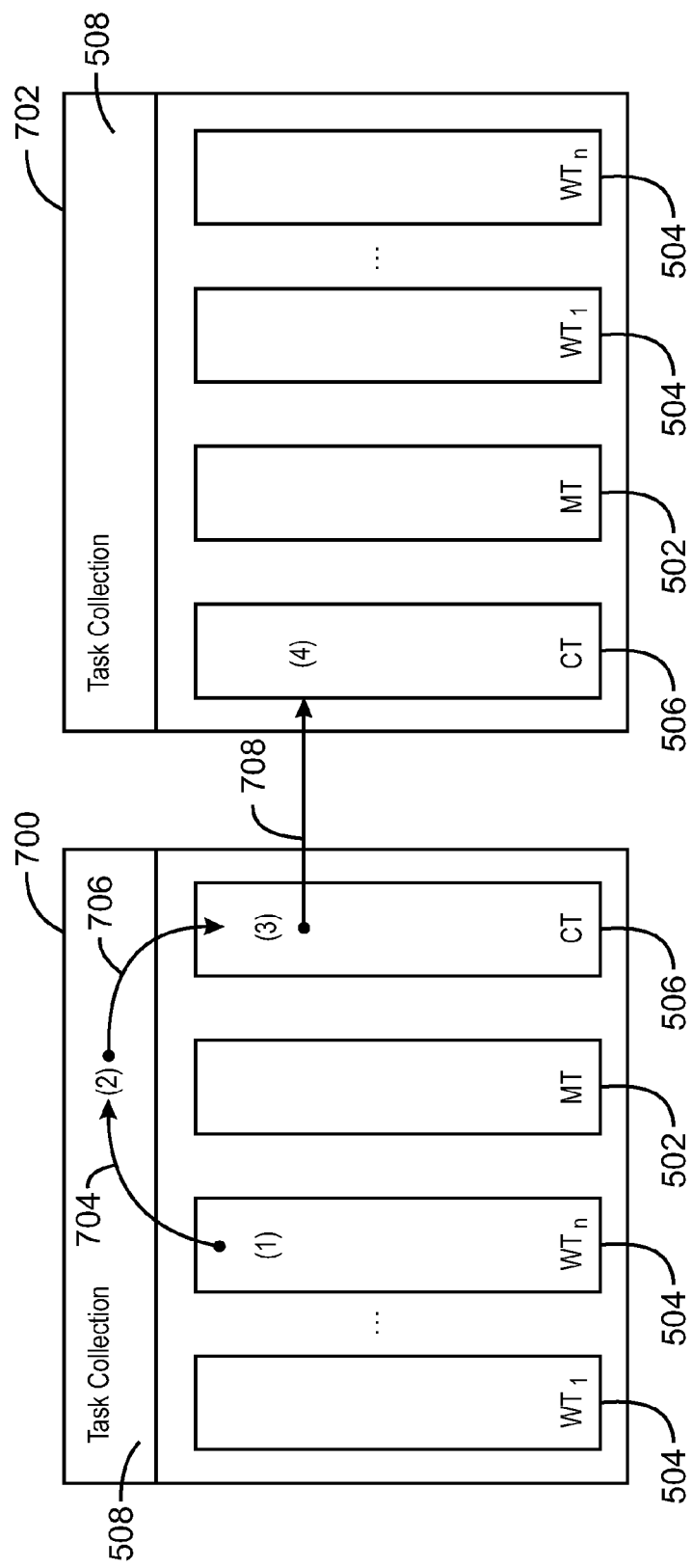
FIG. 7 is an operational diagram of push-type, single-threaded message passing, in accordance with an exemplary embodiment of the present techniques.

FIG. 7 is an operational diagram of push-type, single-threaded message passing, in accordance with an exemplary embodiment of the present techniques. In FIG. 7, the sending SMP node 402 is referred to by the item number 700, and the receiving SMP node 402 is referred to by the item number 702. As shown in FIG. 7, in single-threaded, push-type communications, one of the threads 500 of the sending node 700 creates a communication task for the communication thread 506 of the sending node 700. Although FIG. 7 shows one of the working threads 504 as creating the communication task, the communication task may also be created by the master thread 502. The thread 500 stores the communication task to the task collection 508 of the sending node 700, as indicated by arrow 704. The communication thread 506 of the sending node 700 receives the communication task from the task collection 508 according to the scheduling strategy, as indicated by arrow 706. The communication thread 506 of the sending node 700 then sends the data to the receiving node 702, as indicated by arrow 708. The communication thread 506 of the receiving node 702 receives and processes the data.

Figure 8:
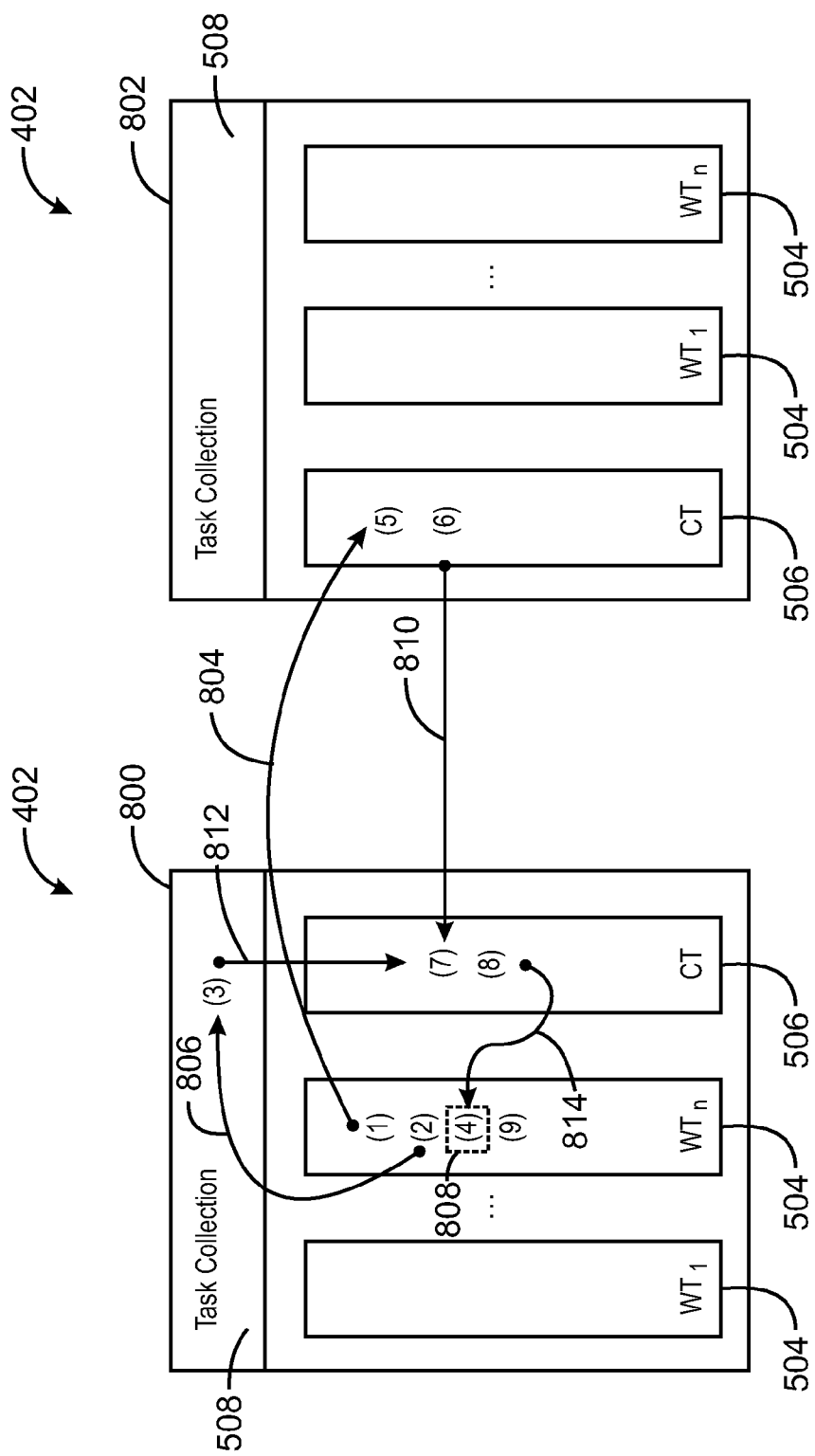
FIG. 8 is an operational diagram of pull-type, multi-threaded message passing, in accordance with an exemplary embodiment of the present techniques.

FIG. 8 is an operational diagram of pull-type, multi-threaded message passing, in accordance with an exemplary embodiment of the present techniques. In pull-type communication, an SMP node 402 can request data from another SMP node 402. The SMP node 402 requesting data is referred to herein as a requesting node 800. The SMP node 402 from which data are being requested is referred to herein as a responding node 802. A request for data may occur when a working thread 504 needs to access data located at another SMP node 402. In multi-threaded, peer-to-peer communications, communications from the requesting node 800 may be handled by the communication thread 506. On the responding node 802, the communication thread 506 receives and processes the data requests, prepares the data, if available, and sends the data to the requesting node 800.

As shown in FIG. 8, in multi-threaded pull-type communications, a thread 500 of the requesting node 800 sends the data request to the requesting node 802, as shown by arrow 804. Although FIG. 8 shows one of the working threads 504 as sending the request, in multi-threaded communications the requesting thread can also be the communication thread 506 or the master thread 502. The requesting thread 500 also notifies the communication thread 506 of the requesting node 800 regarding the request, for example, by creating a communication task for communication thread 506 to receive the data from the responding node 802. The requesting thread 500 sends the communication task into the task collection 508, as shown by arrow 806. The requesting thread 500 then initiates a waiting mode, as shown by box 808.

The communication thread 506 of the responding node 802 receives and processes the request sent by the requesting node 800. For example, the communication thread 506 of the responding node 802 may prepare the requested data using the appropriate synchronization mechanisms, such as the locking mechanism of POSIX threads or Windows threads. The communication thread 506 of the responding node 802 then sends the requested data to the requesting node 800, as indicated by arrow 810. The communication thread 506 of the requesting node 800 receives the communication task from the task collection 508, according to the appropriate scheduling strategy, as indicated by the arrow 812. The communication thread 506 of the requesting node 800 then receives the data sent from the responding node 802.

After receiving the data, the communication thread 506 of the requesting node 800 processes the received data and notifies the requesting thread 504 about availability of the data. The requesting thread 504 then receives the requested data from the communication thread 506 of the requesting node 800, as indicated by arrow 814. The requesting thread 504 then proceeds with its task.

Figure 9:
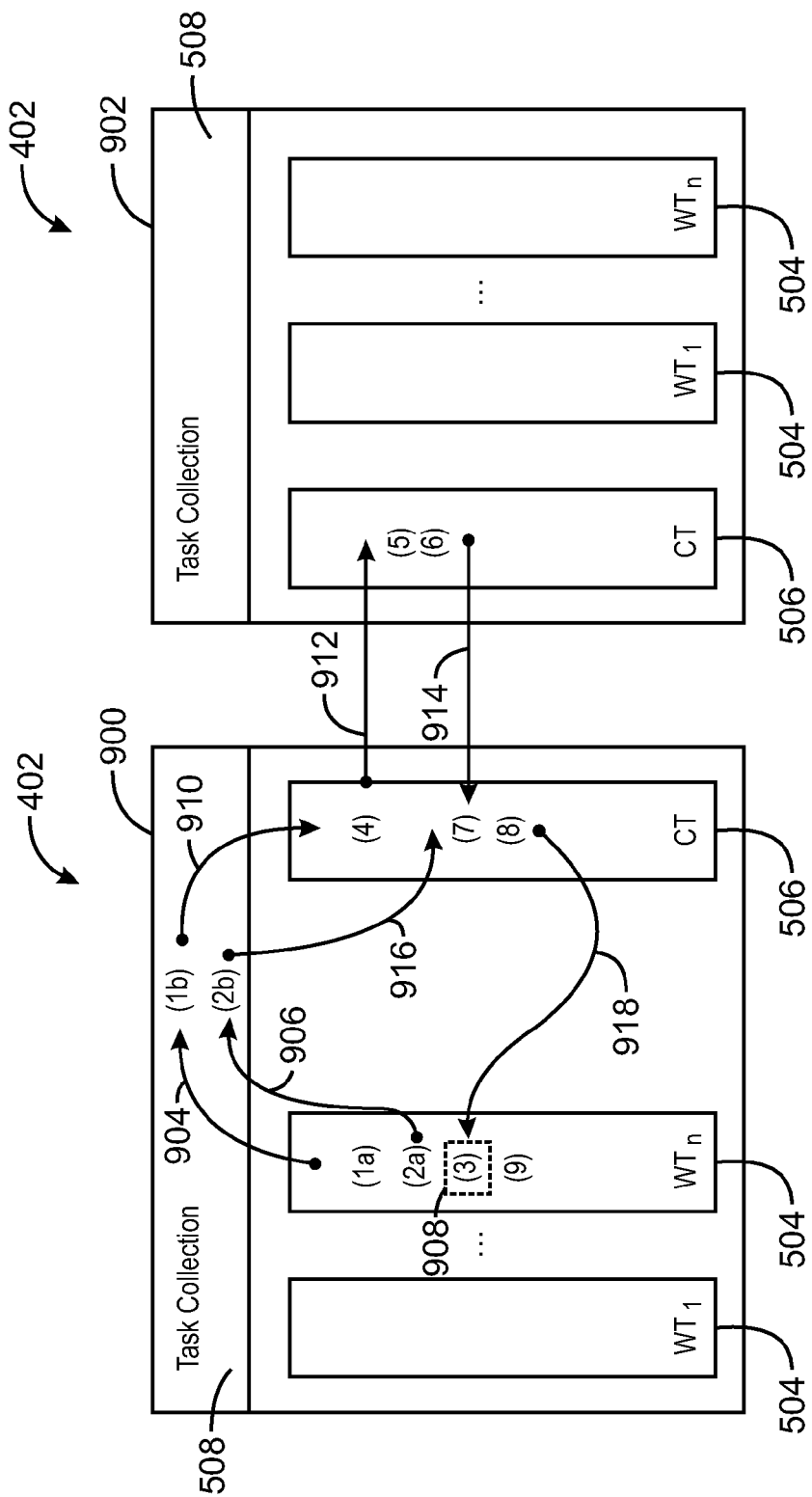
FIG. 9 is an operational diagram of pull-type, single-threaded message passing, in accordance with an exemplary embodiment of the present techniques.

FIG. 9 is an operational diagram of pull-type, single-threaded message passing, in accordance with an exemplary embodiment of the present techniques. Is shown in FIG. 9, the requesting SMP node 402 is indicated by the item number 900 and the responding node SMP 402 is indicated by the item number 902. In pull-type single-threaded communications one of the threads 500 of the requesting node 900 notifies the communications thread 506 of the requesting node 900 regarding the request for data. For example, the thread 500 may create a first communication task that directs the communication thread 506 of the requesting node 900 to send the data request to the responding node 902. The requesting thread 500 stores the task to the task collection 508, as indicated by arrow 904. The requesting thread 500 also creates a second communication task that directs the communication thread 506 of the requesting node 900 to receive the requested data from the responding node 902. The requesting thread 500 stores the second communication task to the task collection 508, as indicated by arrow 906. The requesting thread 500 then initiates a waiting mode, as indicated by the box 908. Although FIG. 9 shows one of the working threads 504 as creating the communication tasks, the communication tasks may also be created by the master thread 502.

The communication thread 506 of the requesting node 900 receives the first communication task from the task collection 508 according to the scheduling strategy, as shown by arrow 910. The communication thread 506 of the requesting node 900 then sends the data request to the responding node 902, as shown by arrow 912. The communication thread 506 of responding node 902 receives and processes the data request. For example, the communication thread 506 of the responding node 902 may prepare the requested data using the appropriate synchronization mechanisms, such as the locking mechanism of POSIX threads or Windows threads. The responding node 902 then sends the requested data to the requesting node 900, as indicated by arrow 914. The communication thread 506 of the responding node 900 receives the second communication task from the task collection 508 according to the scheduling strategy, as shown by arrow 916, and receives the requested data from the responding node 902. The communication thread 506 of the requesting node 900 processes the received data and notifies the requesting thread 500 about the availability of the requested data. The requesting thread 500 then receives the requested data, as indicated by arrow 918. The requesting thread 500 then proceeds with its task.

Task Migration

The task collections 508 described herein may enable two levels of load balancing. A first level of load balancing can occur between the threads of a single SMP node 402, and a second level of load balancing can occur between different SMP nodes 402. Within each SMP node 402, the load balancing can be achieved by a work-stealing algorithm. According to a work-stealing algorithm, a thread 500 that has completed its assigned tasks can retrieve additional tasks from the task collection 508 that were previously assigned to other threads 500. In some embodiments, load balancing between different SMP nodes 402 can be achieved using a task migration algorithm, embodiments of which are described below.

During the reservoir simulator execution, if all of the tasks from a task collection 508 of the SMP node 402 are processed by the working threads 504, the working threads 504 enter a dormant state. The main thread of the SMP node 402, for example, the master thread 502, may send a task migration request to other SMP nodes 402 in the cluster computing system 400. In some embodiments the master thread 502 can send the task migration request to all of the SMP nodes 402 available to the reservoir simulator application. In some embodiments, the master thread 502 can send the task migration request to one other SMP node 402 or a subset of SMP nodes 402, depending on some heuristics. For example, a node can send such request only to its logical neighbors, or to a subset of the nodes belonging to the same computational region, which can be determined by the logic of the reservoir simulation. The SMP node 402 sending the task migration request is referred to herein as the requesting node, and the SMP node 402 receiving the task migration request is referred herein as the responding node.

Each of the SMP nodes 402 can be configured to determine which, if any, of the tasks in its task collection 508 are available to be migrated to another SMP node 402. Tasks that are available to be migrated may be identified as "movable tasks," and tasks that are not available for migration may be identified as "immovable tasks." Heuristics may be used to determine whether a particular task is movable, based on the added communications overhead of the task migration and the benefit of the increased SMP node utilization. For example, if the computational results of a particular task are to be used by the responding node, the communications overhead of migrating the task and then sending the computational results back to the responding node may exceed the benefit of the increased SMP node utilization, in which case, the SMP node 402 may identify the task as immovable. The heuristics used to determine whether a task is movable may take into account any factors that may be useful for determining whether the overall speed of the reservoir simulation may be improved by migrating the task. Such factors may include but are not limited to the speed of the network 408, the processing speed of the SMP nodes 402, the size of the task, and whether the results of the task are to be used by the node, among others.

Upon receiving a task migration request, each of the responding nodes may send a response back to the requesting node, indicating whether the responding node has a movable task. If one of the responding nodes indicates that it has a movable task, the master node 502 of the requesting node receives the task data and sends the task to the task collection 508 of the requesting node. In some embodiments, placing the new task in the task collection 508 can cause the working threads 504 to automatically awake. The task migration workflow may vary depending on whether the multi-threaded or single-threaded communication is used.

Figure 10:
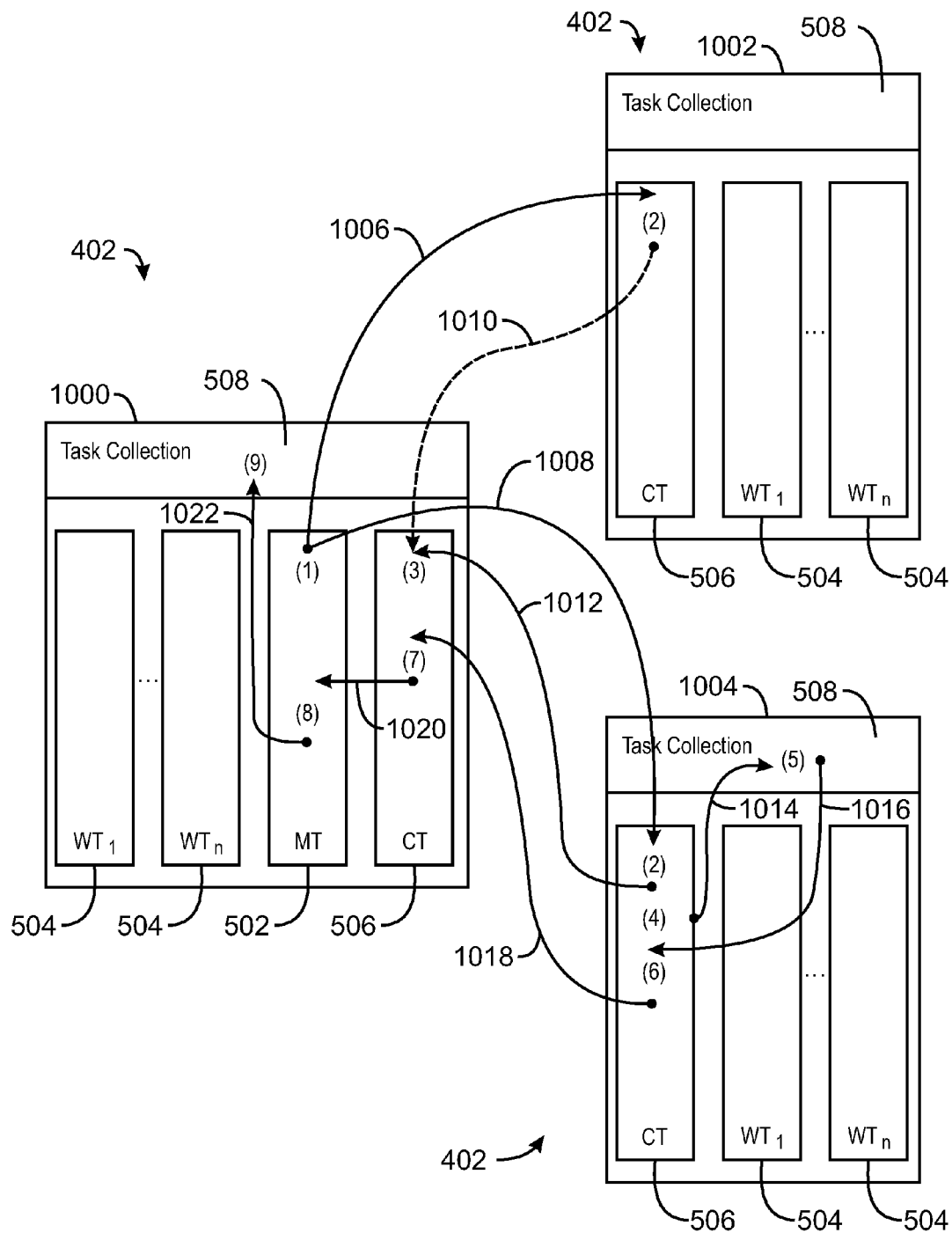
FIG. 10 is an operational diagram of multi-threaded task migration, in accordance with an exemplary embodiment of the present techniques.

FIG. 10 is an operational diagram of multi-threaded task migration, in accordance with an exemplary embodiment of the present techniques. The exemplary workflow pattern shown in FIG. 10 includes a requesting node 1000, a first responding node 1002 that does not have any movable tasks, and a second responding node 1004 that does have movable tasks. In multi-threaded communications, the master thread 502 of the requesting node 1000 may send task migration requests to other SMP nodes 402 directly. As shown in FIG. 10, task migration requests are sent to the first responding node 1002, as indicated by arrow 1006, and the second responding node 1004, as indicated by arrow 1008. For the sake of clarity, only two responding nodes are shown. However, it will be appreciated that the requesting node may send requests to more than two SMP nodes 402, up to the number of SMP nodes 402 in the cluster computing system 400 available to the reservoir simulation application.

The responding nodes 1002 and 1004 receive and process the task migration requests. The first responding node 1002 sends a negative message to the requesting node 1000 indicating that the first responding node 1002 does not have movable tasks, as indicated by arrow 1010. The second responding node 1004 sends a positive message to the requesting node 1000 indicating that the second responding node 1004 does have a movable task, as indicated by arrow 1012.

The communication thread 506 of the requesting node 1000 collects all responses from the responding nodes 1002 and 1004 and prepares a task for receiving the movable task from the second responding node 1004. In cases where multiple SMP nodes 402 respond positively, the communication task may be configured to receive the movable tasks from all of the SMP nodes 402 that responded positively.

The communication thread 506 of the second responding node 1004, which responded positively, updates its task collection 508, as indicated by arrow 1014. The updating of the task collection 508 removes the movable task from the task collection 508. The communication thread 506 of the second responding node 1004 also extracts the movable task and corresponding data from the task collection, as indicated by arrow 1016. The communication thread 506 of the second responding node 1004 then sends the extracted task and corresponding data to the requesting node 1000, as indicated by arrow 1018.

The communication thread 506 of the requesting node 1000 executes the communication task previously created for receiving the task and receives the movable task from the second responding node 1004. The communication thread 506 of the requesting node 1000 then stores the received tasks in the shared memory 406 (FIG. 4). The communication thread 506 of the requesting node 1000 notifies the master thread 502 about presence of the new task, as indicated by arrow 1020. The master thread 502 of the requesting node 1000 receives notification from the communication thread 506 about the presence of the new task, extracts it from shared memory 406, and stores it to the task collection 508, as indicated by arrow 1022. After all responses are processed, the master thread 502 wakes up the group of working threads 504. The new task is now ready to be processed by one of the working threads 504.

Figure 11:
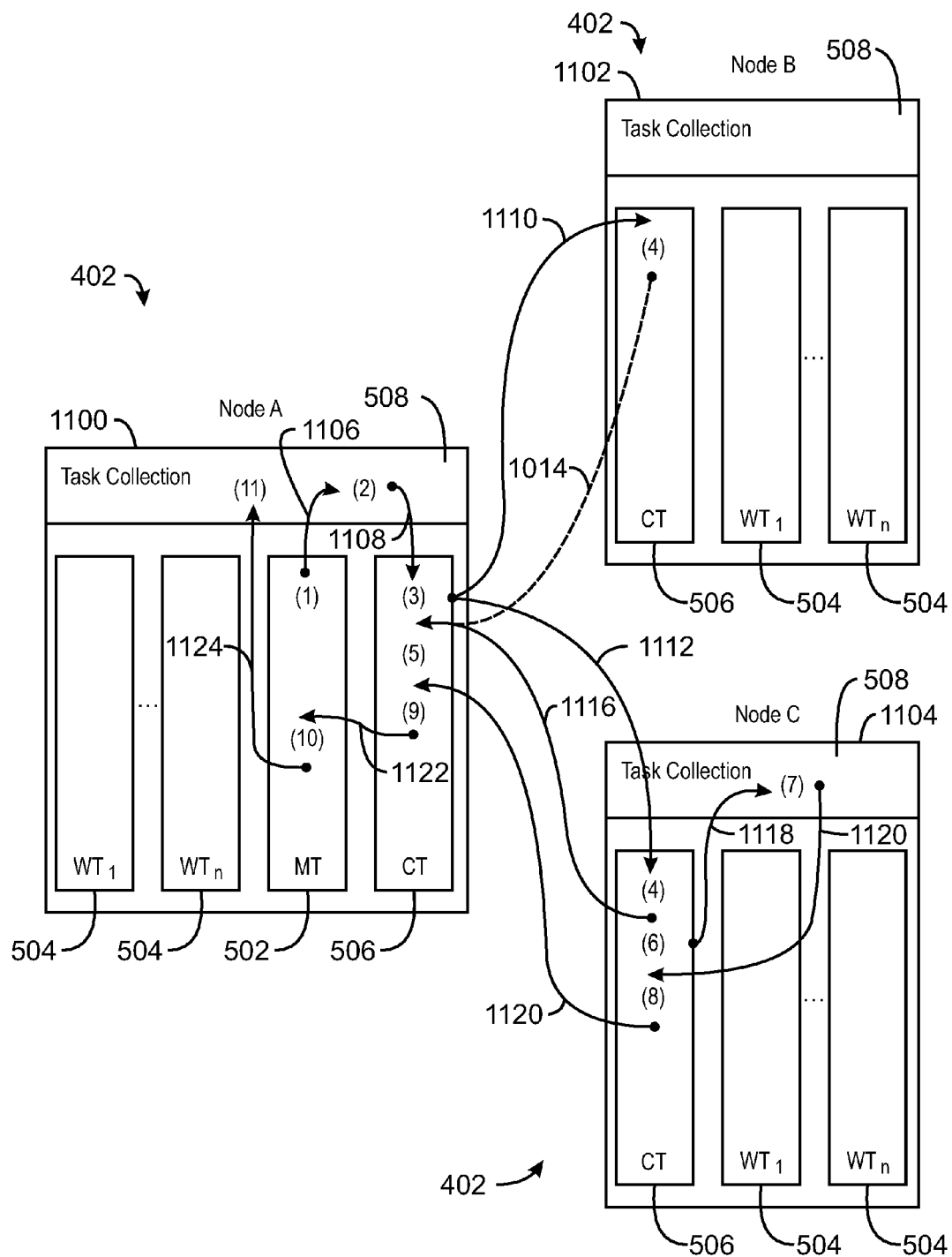
FIG. 11 is an operational diagram of single-threaded task migration, in accordance with an exemplary embodiment of the present techniques.

FIG. 11 is an operational diagram of single-threaded task migration, in accordance with an exemplary embodiment of the present techniques. The exemplary workflow pattern shown in FIG. 11 includes a requesting node 1100, a first responding node 1102 that does not have any movable tasks, and a second responding node 1104 that does have movable tasks. In single-threaded communications, the communication thread 506 of the requesting node 1000 sends task migration requests to other SMP nodes 402. As shown in FIG. 11, the master thread 502 of the requesting node 1100 creates a communication task for the communication thread 506 of the requesting node 1100 and stores the new task to the task collection 508 as indicated by arrow 1106. The communication thread 506 of the requesting node 1100 receives the task from the task collection 508 according to the scheduling strategy, as indicated by arrow 1108.

Pursuant to the received communication task, the communication thread 506 of the requesting node 1100 sends requests to other nodes for movable tasks, which can be transferred to the requesting node 1100 for execution. As shown in FIG. 11, task migration requests are sent to the first responding node 1102, as indicated by arrow 1110, and the second responding node 1104, as indicated by arrow 1112. For the sake of clarity, only two responding nodes are shown. However, it will be appreciated that the requesting node may send requests to more than two SMP nodes 402, up to the number of SMP nodes 402 in the cluster computing system 400 available to the reservoir simulation application.

The responding nodes 1102 and 1104 receive and process the task migration requests. The first responding node 1102 sends a negative message to the requesting node 1100 indicating that the first responding node 1102 does not have movable tasks, as indicated by arrow 1114. The second responding node 1104 sends a positive message to the requesting node 1100 indicating that the responding node 1104 does have a movable task, as indicated by arrow 1116.

The communication thread 506 of the requesting node 1100 collects all responses from the responding nodes 1102 and 1104 and prepares a task for receiving the movable task from the second responding node 1104. In cases where multiple SMP nodes 402 respond positively, the communication task may be configured to receive the movable tasks from all of the SMP nodes 402 that responded positively.

The communication thread 506 of the second responding node 1104, which responded positively, updates its task collection 508, as indicated by arrow 1118. The updating of the task collection 508 removes the movable task from the task collection 508. The communication thread 506 of the second responding node 1104 also extracts the movable task and corresponding data from the task collection, as indicated by arrow 1120. The communication thread 506 of the second responding node 1004 then sends the extracted task and corresponding data to the requesting node 1000, as indicated by arrow 1120.

The communication thread 506 of the requesting node 1100 executes the communication task previously created for receiving the task, and receives the movable task from the second responding node 1104. The communication thread 506 of the requesting node 1100 then stores the received tasks in the shared memory 406 (FIG. 4). The communication thread 506 of the requesting node 1100 notifies the master thread 502 about presence of the new task, as indicated by arrow 1122. The master thread 502 of the requesting node 1100 receives notification from the communication thread 506 about the presence of the new task, extracts it from shared memory 406, and stores it to the task collection 508, as indicated by arrow 1124. After all responses are processed, the master thread 502 of the requesting node 1100 wakes up the group of working threads 504. The new task is now ready to be processed by one of the working threads 504.

Figure 12:
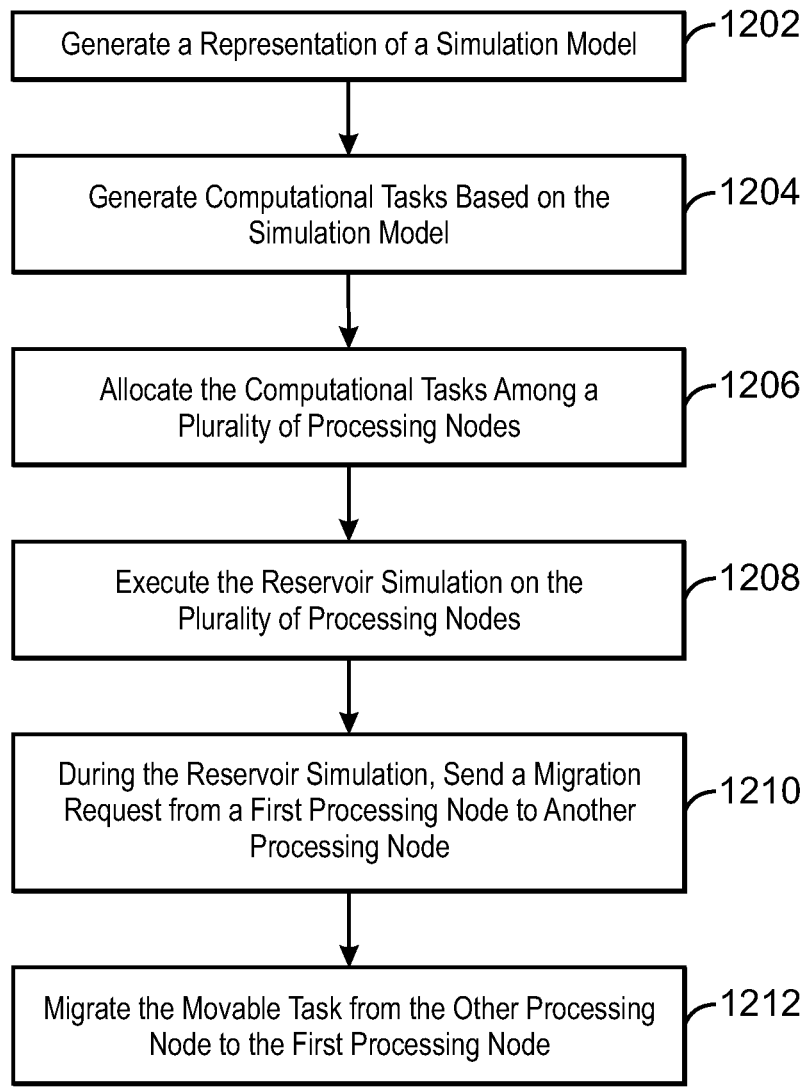
FIG. 12 is a process flow diagram of a summary of a method of executing a reservoir simulation in accordance with an exemplary embodiment of the present techniques.

FIG. 12 is a process flow diagram of a summary of a method of executing a reservoir simulation in accordance with an exemplary embodiment of the present techniques. The method, referred to by the reference number 1200, begins at block 1202. At block 1202 a representation of a simulation model can be generated. The simulation model may be stored to a non-transitory, computer-readable medium such as the cluster storage 412 shown in FIG. 4. At block 1204 a set of computational tasks may be generated based on the simulation model, as discussed in reference to FIG. 3. For example, some of the computational tasks may relate to solving the matrix equation of a computational cell, computing state variables, and the like. At block 1206 the computational tasks may be allocated among a plurality of computational nodes, for example, the SMP nodes 402 shown in FIG. 4. Each processing node may include a plurality of core processors and a shared memory accessible by the plurality of core processors. At block 1208 the reservoir simulation may be executed on the plurality of computational nodes. At block 1210 a migration request may be sent from a first processing node to another processing node in the plurality of computational nodes. The migration request may be sent during the execution of the reservoir simulation if the first processing node finishes executing its allocated computational tasks. The migration request may be configured to request migration of a movable task from other computational nodes to the first processing node to balance the computational load between the computational nodes. At block 1212, if the other processing node responds positively, the movable task may be migrated from the other processing node to the first processing node.

While the present techniques may be susceptible to various modifications and alternative forms, the exemplary embodiments discussed above have been shown only by way of example. However, it should again be understood that the present techniques are not intended to be limited to the particular embodiments disclosed herein. Indeed, the present techniques include all alternatives, modifications, and equivalents falling within the true spirit and scope of the appended claims.

What is claimed is:

1. A method for executing a reservoir simulation, comprising:
    generating, using a computer, a representation of a simulation model;
    generating a plurality of computational tasks based, at least in part, on the simulation model;
    allocating the computational tasks among a plurality of computational nodes, wherein each computational node of the plurality of computational nodes includes a plurality of core processors and a shared memory accessible by the plurality of core processors;
    executing the reservoir simulation on the plurality of computational nodes;
    during the reservoir simulation, (i) sending a migration request from a first computational node in the plurality of computational nodes to two or more computational nodes in the plurality of computational nodes when the first computational node finishes executing the computational tasks allocated to the first computational node, the migration request configured to request migration of a movable task from the two or more computational nodes to the first computational node, wherein the first computational node communicates the migration request via a network to the two or more computational nodes, and (ii) migrating the movable task from at least one of the two or more computational nodes to the first computational node; and inferring a behavior of a real hydrocarbon-bearing reservoir from the performance of the simulation model.

2. The method of claim 1, wherein executing the reservoir simulation on the plurality of computational nodes comprises generating a master thread on each of the computational nodes, the master thread generating one or more working threads configured to receive computational tasks from a task collection stored in the shared memory in each of the computational nodes.

3. The method of claim 2, wherein executing the reservoir simulation on the plurality of computational nodes comprises the master thread generating a communication thread configured to handle communications between the plurality of computational nodes.

4. The method of claim 1, comprising identifying computational tasks allocated to each computational node as movable based, at least in part, on an added communications overhead of the task migration and a benefit of increased computational node utilization.

5. The method of claim 1, wherein sending the migration request to the two or more computational nodes, comprises:
a master thread of the first computational node generating a communication task corresponding to the task migration request and storing the communication task to a task collection of the first computational node; and
a communication thread of the first computational node receiving the communication task from the task collection and sending the corresponding task migration request to the two or more computational nodes.

6. The method of claim 1, wherein sending a migration request to the two or more computational nodes comprises a master thread of the first computational node generating the task migration request and sending the task migration request to the two or more computational nodes.

7. The method of claim 1, comprising each of the computational nodes generating a task collection and one or more working threads, wherein the working threads receive tasks from the task collection and create new tasks to send to the task collection.

8. A system for modeling reservoir properties, comprising:
a non-transitory storage medium comprising a representation of a reservoir model;
a plurality of computational nodes operatively coupled by a communications network, each computational node of the plurality of computational nodes comprising a plurality of core processors and a shared memory accessible to the plurality of core processors;
a machine readable medium comprising code configured to assign computational tasks to the plurality of computational nodes for the execution of a reservoir simulation based, at least in part, on the reservoir model;
wherein a computational node in the plurality of computational nodes comprises code configured to:
execute the computational tasks assigned to the computational node;
send a migration request from the computational node in the plurality of computational nodes to other computational nodes in the plurality of computational nodes when the computational node finishes executing the allocated computational tasks, the migration request configured to request migration of a movable task from the other computational nodes to the computational node, wherein the computational node communicates the migration request via the communications network to the other computational nodes; and
receive the movable task from at least one of the other computational nodes; and
wherein the reservoir model is useful for inferring a behavior of a real hydrocarbon-bearing reservoir from the performance of the simulation model.

9. The system of claim 8, wherein a master thread of the computational node is configured to generate a task collection stored to the shared memory and a working thread configured to receive tasks from the task collection and send tasks to the task collection.

10. The system of claim 9, wherein the computational node is configured to handle multi-threaded communications, wherein the master thread and the working thread are configured to send data to other computational nodes over the network.

11. The system of claim 9, wherein the master thread of the computational node is configured to generate a communication thread configured to handle single-threaded communications between the computational nodes, wherein:
the working thread of the computational node generates a communication task that includes corresponding data to be transmitted to other computational nodes and stores the communication task to the task collection; and
the communication thread receives the communication task from the task collection and sends the corresponding data to the other computational nodes.

12. The system of claim 8, wherein the computational node comprises code configured to identify computational tasks allocated to the computational node as movable based, at least in part, on an added communications overhead of the task migration and a benefit of increased computational node utilization.

13. The system of claim 8, wherein the computational node is configured to:
send a task migration request to other computational nodes in the plurality of computational nodes if the computational node finishes executing its assigned computational tasks;
receive new tasks from the other computational nodes that respond positively; and
add the new tasks to the task collection of the computational node.

14. The system of claim 9, wherein:
the master thread of the computational node is configured to generate a communication task corresponding to a task migration request and store the communication task to the task collection of the computational node; and
a communication thread of the computational node is configured to receive the communication task from the task collection and send the corresponding task migration request to another computational node over the network.

15. The system of claim 9, wherein the master thread of the computational node is configured to generating a task migration request if the computational node finishes executing its assigned computational tasks and send the task migration request to the other computational node.

16. A non-transitory, computer readable medium comprising code configured to direct a processor to:
generate one or more working threads configured to perform a set of computational tasks corresponding to a reservoir simulation;

generate a task collection configured to hold the set of computational tasks, wherein the working threads are configured to receive computational tasks from the task collection and send new tasks to the task collection;

send a migration request to two or more computational nodes when the working threads finish executing the computational tasks in the task collection, the migration request configured to request migration of a movable task from the two or more computational nodes, wherein the migration request is sent via a network to the two or more computational nodes; and receive a movable task from at least one of the two or more computational nodes and add the movable task to the task collection;

wherein the reservoir model is useful for inferring a behavior of a real hydrocarbon-bearing reservoir from the performance of the simulation model.

17. The non-transitory, computer readable medium of claim 16, comprising code configured to direct the processor to generate a communication thread configured to handle communications with the two or more computational nodes.

18. The non-transitory, computer readable medium of claim 17, comprising code configured to:

generate a communication task corresponding to the task migration request and store the communication task to the task collection;

wherein the communication thread is configured to receive the communication task from the task collection and send the corresponding task migration request to another computational node over a network.

19. The non-transitory, computer readable medium of claim 17, wherein the communication thread is configured to receive the movable task from at least one of the two or more computational node, store the movable task to a shared memory, and alert a master thread regarding the existence of the movable task; and the master thread is configured to store the movable task to the task collection.

20. The non-transitory, computer readable medium of claim 16, comprising code configured to identify computational tasks in the task collection as movable based, at least in part, on heuristics that consider an added communications overhead of the task migration and a benefit of increased computational node utilization.

* * * * *